(12) United States Patent
Morita et al.

(10) Patent No.: US 11,557,248 B2
(45) Date of Patent: Jan. 17, 2023

(54) DISPLAY DEVICE

(71) Applicant: Japan Display Inc., Tokyo (JP)

(72) Inventors: Tetsuo Morita, Tokyo (JP); Yasuhiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/520,959

(22) Filed: Nov. 8, 2021

(65) Prior Publication Data
US 2022/0059026 A1 Feb. 24, 2022

Related U.S. Application Data

(63) Continuation of application No. 17/113,175, filed on Dec. 7, 2020, now Pat. No. 11,195,453, which is a continuation of application No. PCT/JP2019/019185, filed on May 14, 2019.

(30) Foreign Application Priority Data

Jun. 7, 2018 (JP) .............................. JP2018-109436

(51) Int. Cl.
*G09G 3/00* (2006.01)
*G09G 3/32* (2016.01)
*G09G 3/20* (2006.01)
*H01L 25/075* (2006.01)

(52) U.S. Cl.
CPC .............. *G09G 3/32* (2013.01); *G09G 3/2003* (2013.01); *H01L 25/0753* (2013.01); *G09G 2300/0426* (2013.01); *G09G 2300/0452* (2013.01); *G09G 2300/08* (2013.01); *G09G 2330/00* (2013.01)

(58) Field of Classification Search
None
See application file for complete search history.

(56) References Cited

U.S. PATENT DOCUMENTS

2010/0149143 A1* 6/2010 Yamamoto ........... G09G 3/3233
345/205
2017/0338211 A1* 11/2017 Lin ..................... H01L 25/0753

OTHER PUBLICATIONS

Japanese Office Action dated Feb. 1, 2022, for the corresponding Japanese Application No. 2018-109436, with Global Dossier English translation.

* cited by examiner

*Primary Examiner* — Michael A Faragalla
(74) *Attorney, Agent, or Firm* — Michael Best & Friedrich LLP

(57) ABSTRACT

According to one embodiment, a display device includes a display region where pixels are arranged. Each of the pixels includes a pixel electrode, a light emitting element, a drive transistor, a first capacitance electrode layer opposed to the pixel electrode and held at a constant potential, and an insulating layer forming an auxiliary capacitance together with the pixel electrode and the first capacitance electrode layer. A value of the auxiliary capacitance of the first pixel, of the values of the auxiliary capacitance of the pixels is the largest.

12 Claims, 17 Drawing Sheets

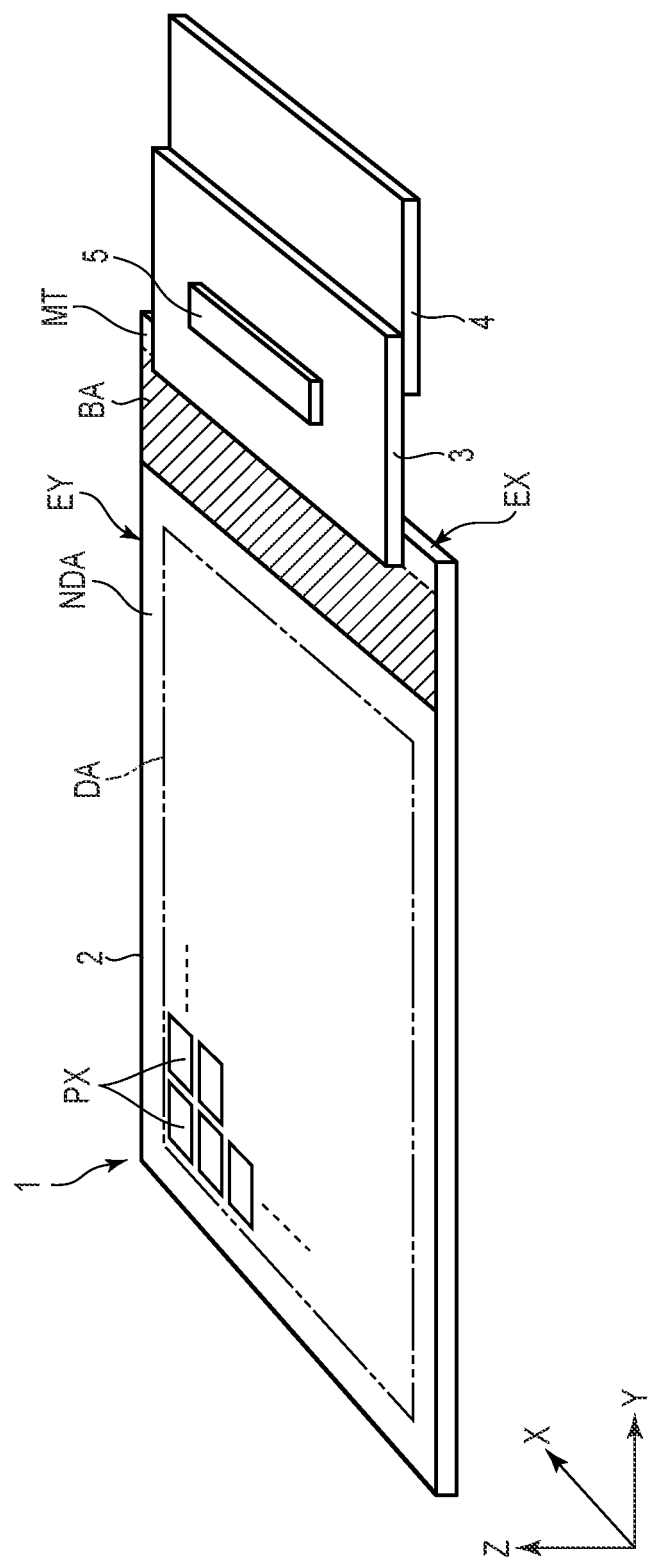
F I G. 1

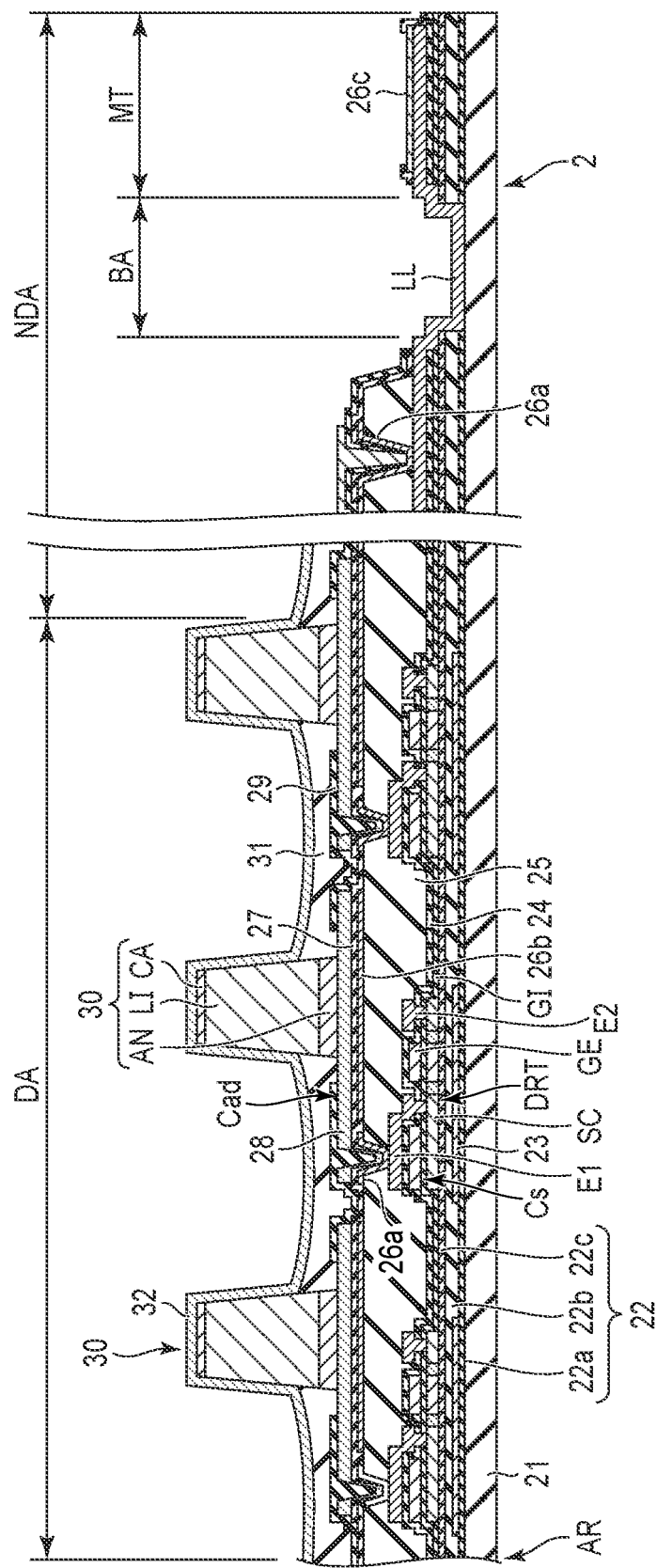
F I G. 4

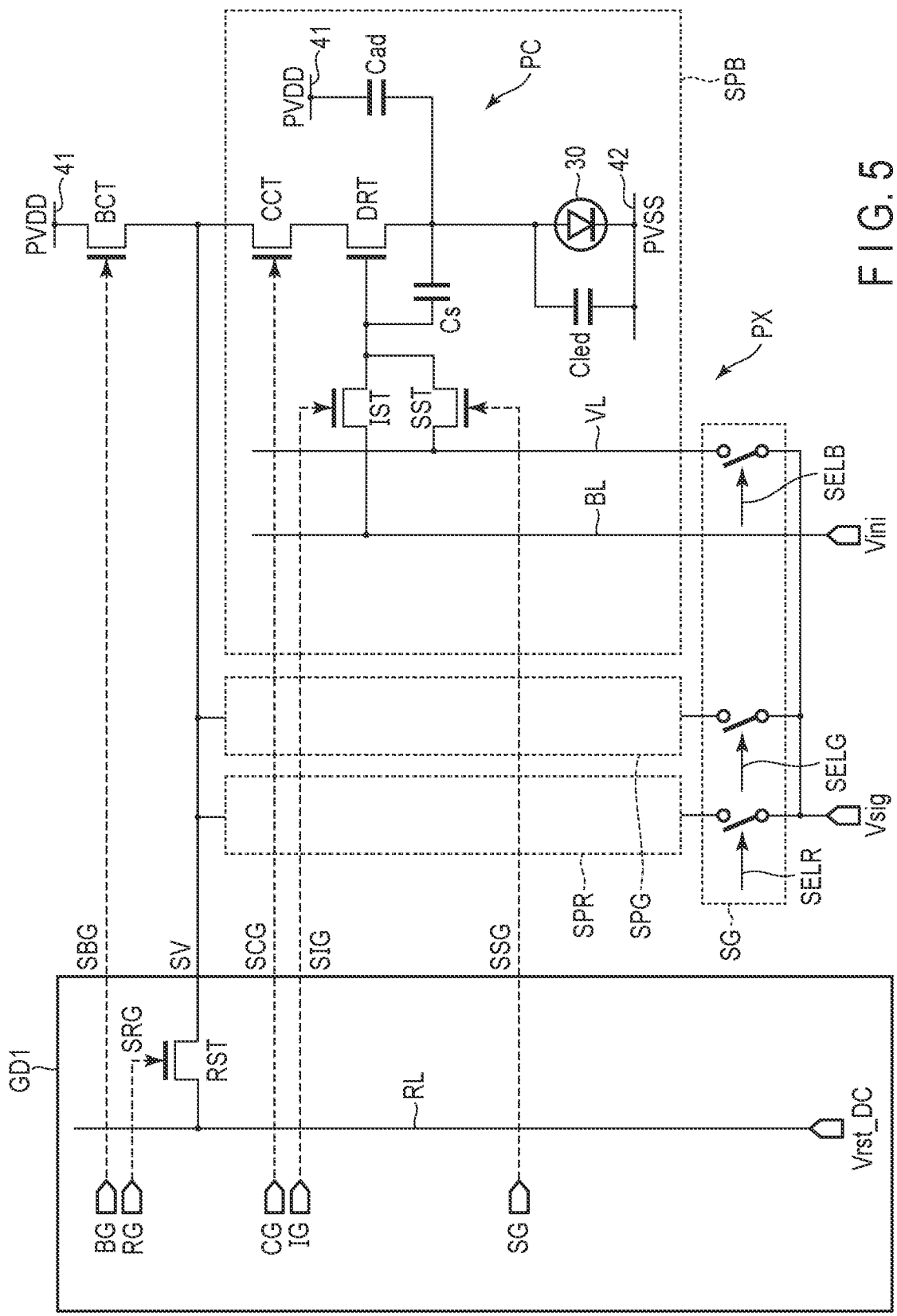
F I G. 5

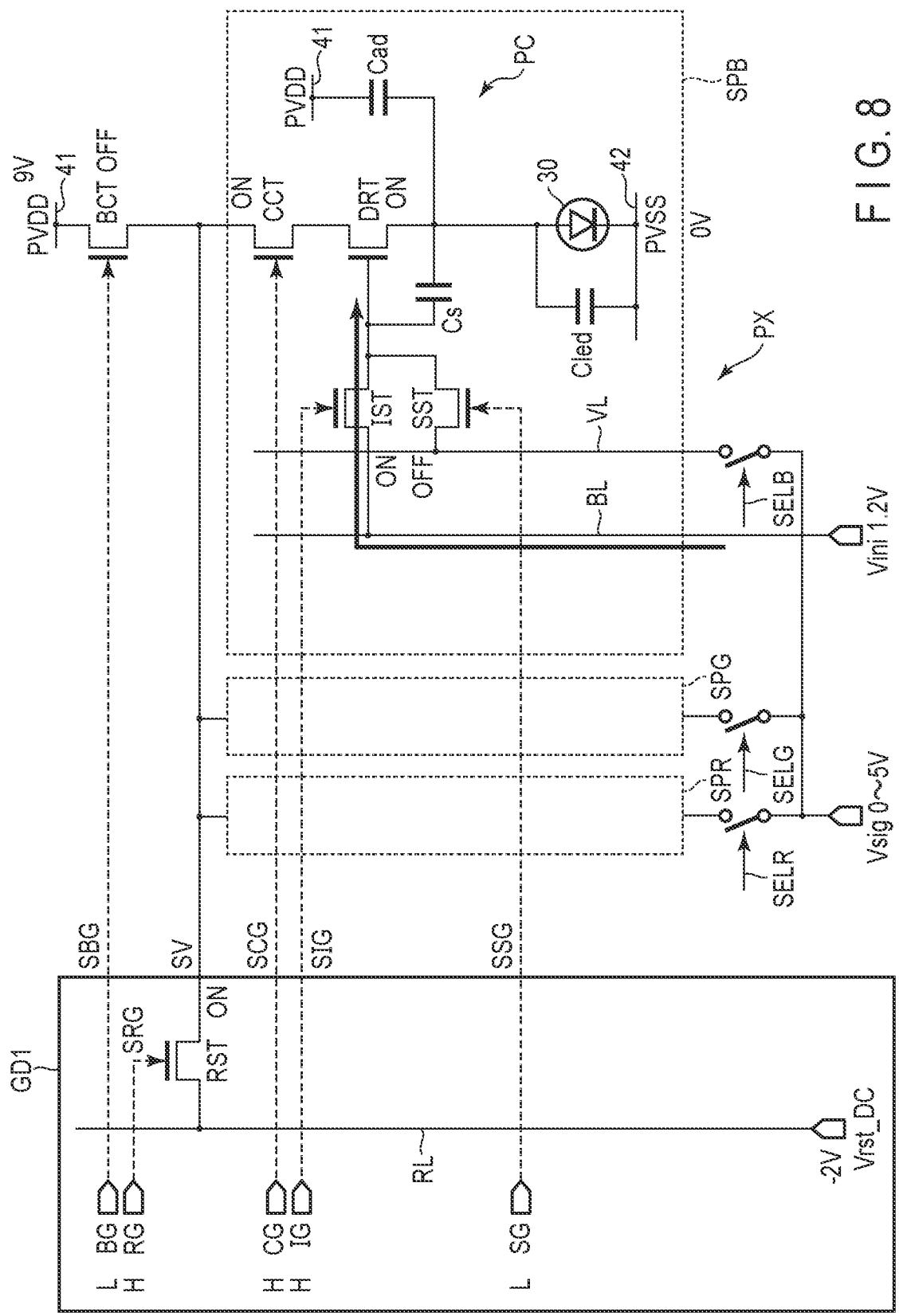
F I G. 8

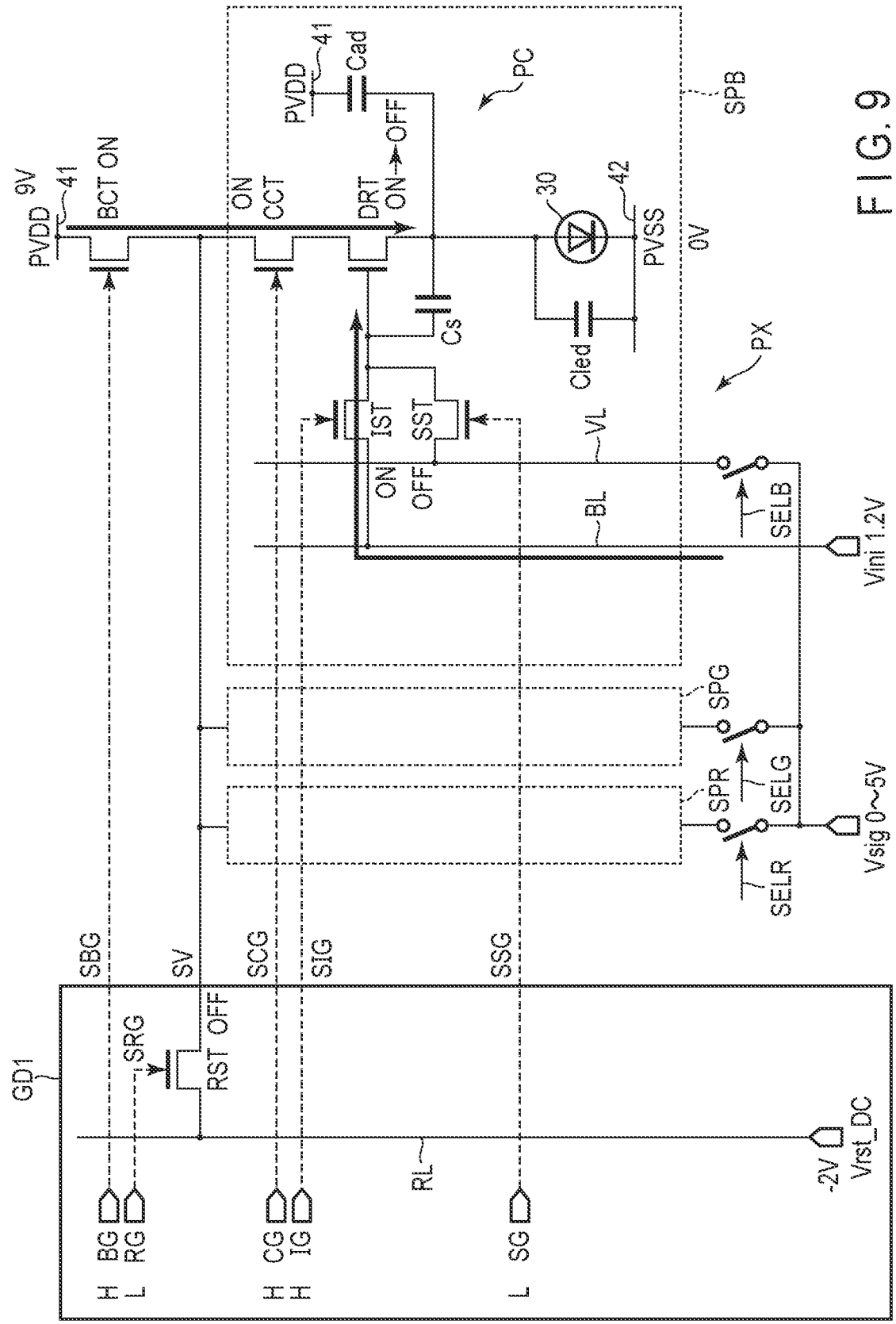
F I G. 9

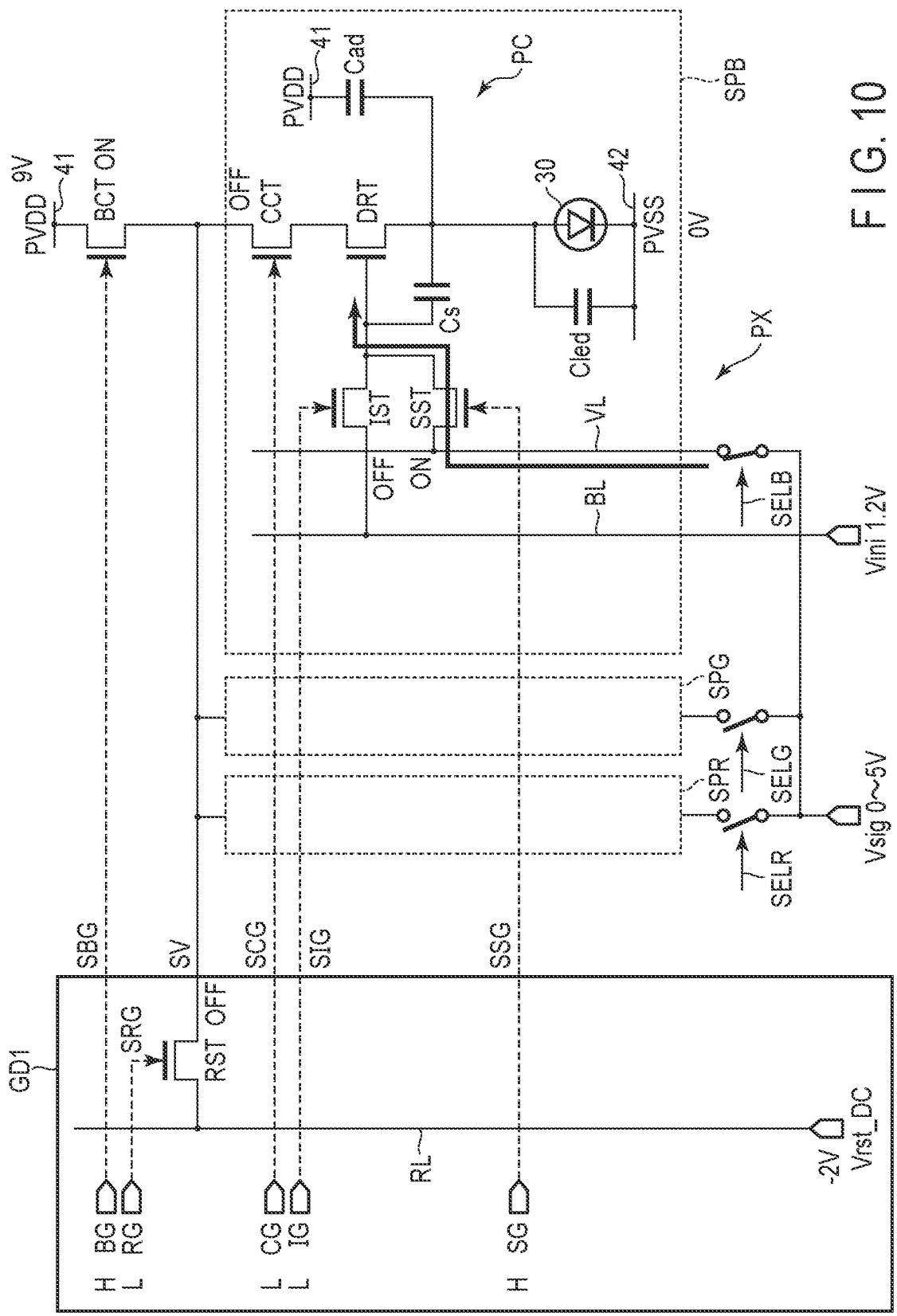
F I G. 10

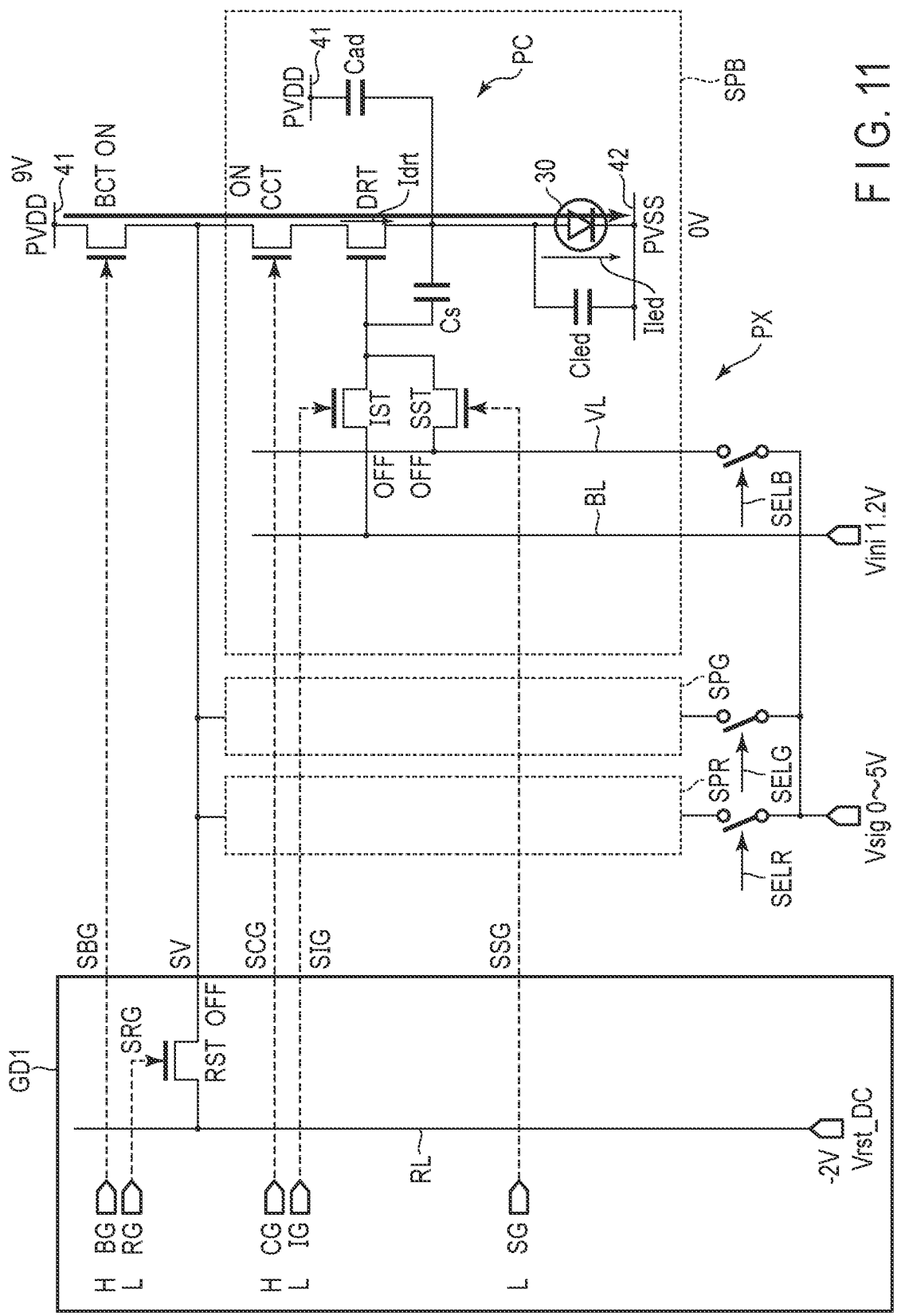
F I G. 11

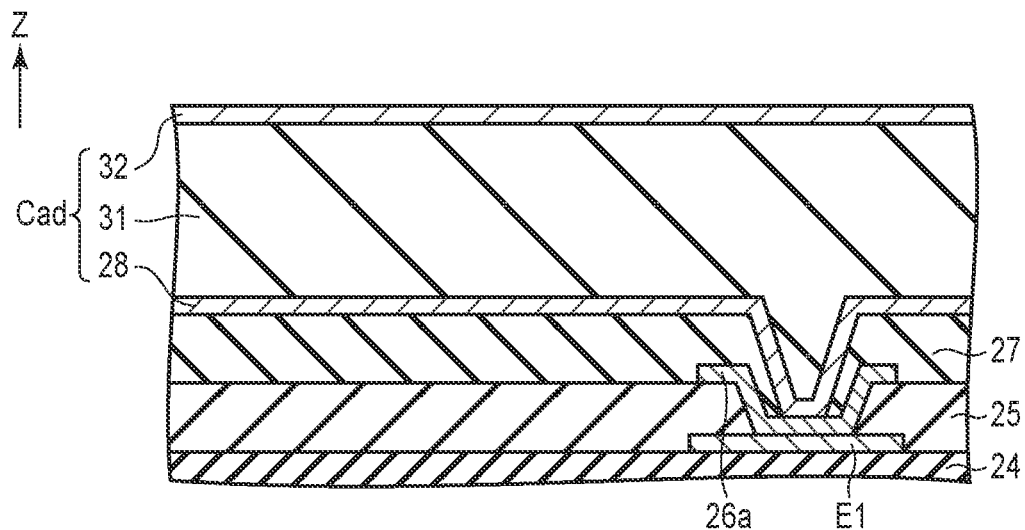
F I G. 19
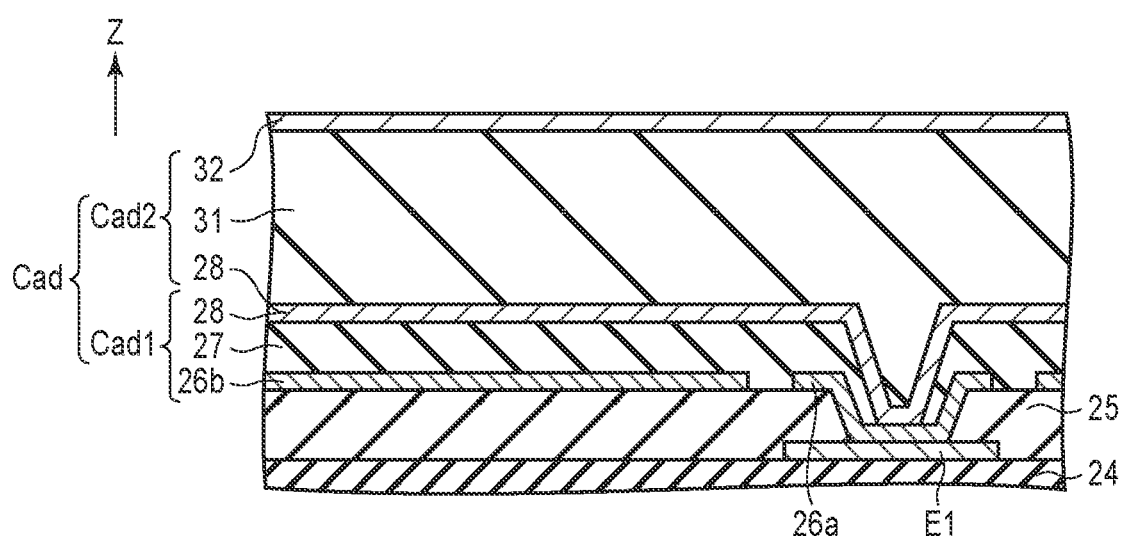
F I G. 20

DISPLAY DEVICE

CROSS-REFERENCE TO RELATED APPLICATIONS

This application is a Continuation Application of application Ser. No. 17/113,175, filed Dec. 7, 2020, which is a Continuation Application of PCT Application No. PCT/JP2019/019185, filed May 14, 2019 and based upon and claiming the benefit of priority from Japanese Patent Application No. 2018-109436, filed Jun. 7, 2018, the entire contents of all of which are incorporated herein by reference.

FIELD

Embodiments described herein relate generally to a display device.

BACKGROUND

LED display devices using light emitting diodes (LED) that are spontaneous light-emitting elements are known as display devices. Recently, a display device (hereinafter referred to as a micro-LED display device) in which minute light-emitting diodes referred to as micro-LED are mounted on an array substrate has been developed as a higher definition display device.

Since the micro-LED display is formed such that a large number of chip-like micro-LED are mounted in the display area, unlike the conventional liquid crystal display or organic EL display, both higher definition and larger scale of the display can easily be achieved and the display is focused as a next generation display device.

BRIEF DESCRIPTION OF THE DRAWINGS

FIG. 1 is a perspective view showing a configuration example of a display device according to one of embodiments.

FIG. 4 is a cross-sectional view showing a modified example of the display device.

FIG. 5 is a circuit diagram illustrating an example of the display device.

FIG. 8 is a circuit diagram illustrating the method of driving the display device subsequently to FIG. 7, and also illustrating the reset operation on a gate side of the drive transistor.

FIG. 9 is a circuit diagram illustrating the driving method subsequently to FIG. 8, and also illustrating the offset cancel operation.

FIG. 10 is a circuit diagram illustrating the driving method subsequently to FIG. 9, and also illustrating a write operation of a video signal.

FIG. 11 is a circuit diagram illustrating the driving method subsequently to FIG. 10, and also illustrating an emission operation of a light emitting element.

FIG. 19 is a cross-sectional view showing the display panel of the display device according to modified example 5 of the embodiment, illustrating the first electrode, the conductive layer, the pixel electrode, the counter-electrode, etc.

FIG. 20 is a cross-sectional view showing the display panel of the display device according to modified example 6 of the embodiment, illustrating the first electrode, the conductive layer, the pixel electrode, the counter-electrode, etc.

DETAILED DESCRIPTION

Figure 2:
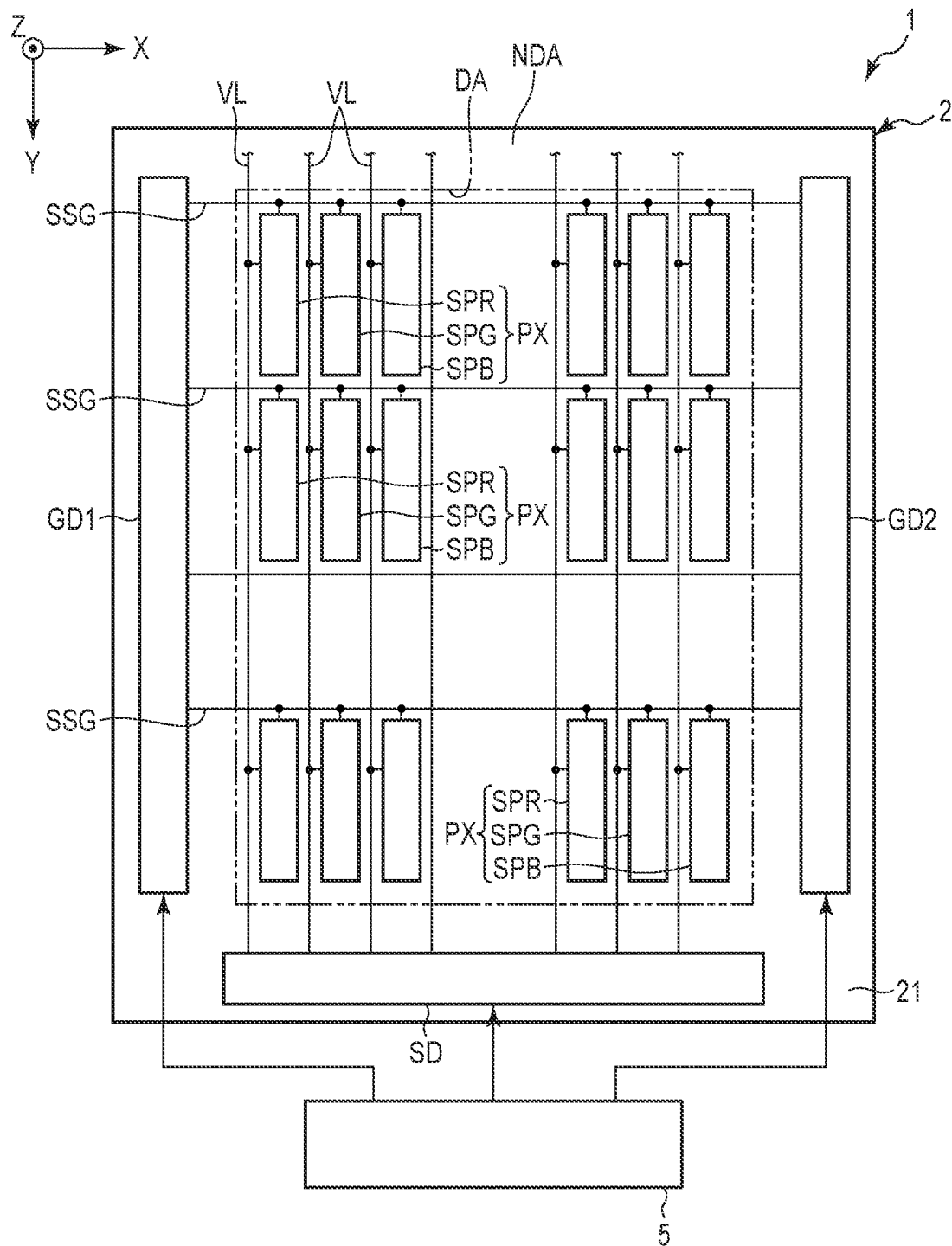
FIG. 2 is a plan view showing a circuit configuration of the display device.

In general, according to one embodiment, there is provided a display device comprising a display region where a plurality of pixels are arranged. Each of the pixels includes a pixel electrode, a light emitting element including a first electrode electrically connected to the pixel electrode, a drive transistor controlling a current value for the light emitting element, a first capacitance electrode layer opposed to the pixel electrode and held at a constant potential, and an insulating layer interposed between the pixel electrode and the first capacitance electrode layer to form an auxiliary capacitance together with the pixel electrode and the first capacitance electrode layer. The plurality of pixels include a first pixel displaying a first color. A value of the auxiliary capacitance of the first pixel, of the values of the auxiliary capacitance of the plurality of pixels is the largest.

Embodiment

One of embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

FIG. 1 is a perspective view showing a configuration of a display device 1 according to the embodiment. FIG. 1 illustrates a three-dimensional space which is defined by a first direction X, a second direction Y perpendicular to the first direction X, and a third direction Z perpendicular to the first direction X and the second direction Y. The first direction X and the second direction Y are orthogonal to each other, but may intersect at an angle other than 90 degrees. In addition, in the embodiment, the third direction Z is defined as an upper or upward direction, and a direction opposite to the third direction Z is defined as a lower or downward direction. According to "a second memberon a first member" and "a second memberunder a first member", the second member may be in contact with the first member or remote from the first member.

In the embodiment, an example where the display device 1 is a micro-LED display device using a micro-light-emitting diode [hereinafter referred to as a micro-light emitting diode (micro-LED), which is a spontaneous light-emitting element] will be mainly described below.

A shown in FIG. 1, the display device 1 comprises a display panel 2, a first circuit board 3, a second circuit board 4, and the like.

The display panel 2 has, for example, a rectangular shape. In the example illustrated, shorter sides EX of the display panel 2 are parallel to the first direction X and longer sides EY of the display panel 2 are parallel to the second direction Y. The third direction Z corresponds to a thickness direction of the display panel 2. The main surface of the display panel 2 is parallel to an X-Y plane defined by the first direction X and the second direction Y. The display panel 2 includes a display region DA and a non-display region NDA located outside the display region DA. The non-display region NDA includes a terminal region MT. In the example illustrated, the non-display region NDA surrounds the display region DA.

The display region DA is a region for displaying an image and includes, for example, a plurality of main pixels PX arrayed in a matrix.

The terminal region MT is provided along the shorter sides EX of the display panel 2, and includes terminals for electrically connecting the display panel 2 to an external device, and the like.

The first circuit board 3 is mounted on the terminal region MT and is electrically connected to the display panel 2. The first circuit board 3 is, for example, a flexible printed circuit. The first circuit board 3 comprises a driver IC chip (hereinafter referred to as a panel driver) 5 which drives the display panel 2, and the like. Incidentally, in the example illustrated, the panel driver 5 is arranged on the first circuit board 3 but may be arranged under the first circuit board 3. Alternatively, the panel driver 5 may be mounted on a part other than the first circuit board 3, for example, the second circuit board 4. The second circuit board 4 is, for example, a flexible printed circuit. The second circuit board 4 is connected to the first circuit board 3, for example, at a position under the first circuit board 3.

The above panel driver 5 is connected to a control board (not shown) via, for example, the second circuit board 4. For example, the panel driver 5 performs control of displaying an image on the display panel 2 by driving a plurality of main pixels PX, based on a video signal output from the control boards.

Incidentally, the display panel 2 may include a fold region BA represented by oblique lines. The fold region BA is a region which is folded when the display device 1 is accommodated in the housing of the electronic apparatus or the like. The fold region BA is located on the terminal region MT side of the non-display region NDA. In a state in which the fold region BA is folded, the first circuit board 3 and the second circuit board 4 are arranged under the display panel 2 so as to be opposed to the display panel 2.

FIG. 2 is a plan view showing a circuit configuration of the display device 1.

As shown in FIG. 2, the display device 1 comprises an active matrix display panel 2. The display panel 2 includes an insulating substrate 21, and a plurality of main pixels PX, various lines, gate drivers GD1 and GD2, and a select circuit SD, which are arranged on the insulating substrate 21.

A plurality of main pixels PX are arrayed in a matrix in the display region DA. Each of the main pixels PX includes a plurality of pixels SP. In the embodiment, the main pixels PX include three types of pixels, i.e., a first pixel SPR displaying a first color, a second pixel SPG displaying a second color, and a third pixel SPB displaying a third color. In this example, the first color is red, the second color is green, and the third color is blue.

The main pixels PX include a light emitting element (micro-LED) and a pixel circuit for supplying a drive current to the light emitting element to drive the light emitting element. The pixel circuit includes a drive transistor, various switching elements, and the like, which will be described later. The embodiment has been described with terms such as the main pixels PX and the pixels SP. However, the main pixels PX can be restated to pixels. In this case, the pixels SP are sub-pixels.

The various lines extend in the display region DA and are drawn to the non-display region NDA. In FIG. 2, a plurality of control lines SSG and a plurality of image signal lines VL are exemplified as parts of various lines. The gate drivers GD1 and GD2 and the select circuit SD are located in the non-display region NDA. In the display region DA, the control lines SSG and the image signal lines VL are connected to the pixels SP. The control lines SSG are connected to the gate drivers GD1 and GD2 in the non-display region NDA. The image signal lines VL are connected to the select circuit SD in the non-display region NDA.

Various signals and voltages are supplied from the panel driver 5 to the gate drivers GD1 and GD2 and the select circuit SD.

Figure 3:
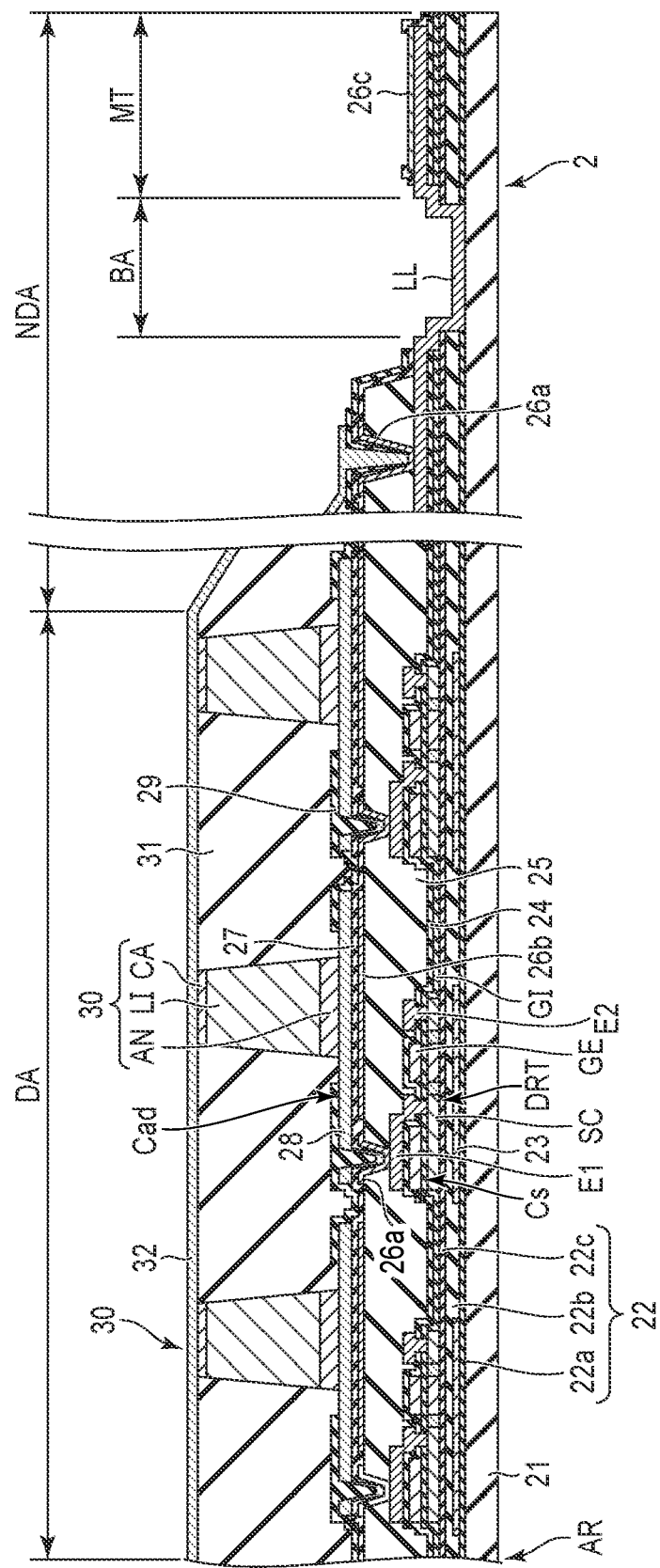
FIG. 3 is a cross-sectional view showing the display device.

FIG. 3 is a cross-sectional view showing the display device. An example in which a fine light emitting element referred to as the micro-LED is mounted on the pixel electrode as a display element will be described. The display region DA and the non-display region NDA are mainly shown in FIG. 3. Incidentally, the non-display region NDA includes the fold region BA which can be folded and the terminal region MT.

As shown in FIG. 3, an array substrate AR of the display panel 2 comprises the insulating substrate 21. A glass substrate of quartz, alkali-free glass, etc., or a resin substrate of polyimide, etc., can be mainly used as the insulating substrate 21. The material of the insulating substrate 21 may be a material withstanding a processing temperature in manufacturing of a thin film transistor (TFT). When the insulating substrate 21 is a flexible resin substrate, the display device 1 can be composed of a sheet display. The resin substrate may be formed of not polyimide, but the other resin material. Incidentally, when polyimide or the like is used to form the insulating substrate 21, the insulating substrate 21 may be referred to as an organic insulating layer or a resin layer, more appropriately.

An undercoat layer 22 of a three-layer stacked structure is provided on the insulating substrate 21. The undercoat layer 22 includes a first layer 22a formed of a silicon oxide (SiO2), a second layer 22b formed of a silicon nitride (SiN), and a third layer 22c formed of a silicon oxide (SiO2). The first layer 22a, which is the lowermost layer, is provided to improve adherence to the insulating substrate 21 which is a base. The second layer 22b, which is an intermediate layer, is provided as a block film for moisture and impurities from the outside. The third layer 22c, which is the uppermost layer, is provided as a block film preventing hydrogen atoms contained in the second layer 22b from being diffused to a semiconductor layer SC side to be described later. Incidentally, the undercoat layer 22 is not limited to this structure. The undercoat layer 22 may include further stacked layers or may have a single-layer structure or a two-layer structure. For example, when the insulating substrate 21 is formed of a glass, a silicon nitride film may be formed directly on the insulating substrate 21 since the silicon nitride film has a comparatively good adherence.

A light-shielding layer 23 is arranged on the insulating substrate 21. The position of the light-shielding layer 23 is made to correspond to a location where TFT is to be formed later. In the embodiment, the light-shielding layer 23 is formed of a metal. However, the light-shielding layer 23 may be formed of a material having a light-shielding property such as a black layer. In addition, in the embodiment, the light-shielding layer 23 is provided on the first layer 22a and is covered with the second layer 22b. Incidentally, the light-shielding layer 23 may be provided on the insulating substrate 21 and covered with the first layer 22a, unlike the embodiment. According to the light-shielding layer 23, entry of light to a back surface of the channel layer of the TFT can be suppressed, and variation in the TFT properties resulting from the light can be made incident from the insulating substrate 21 side can be suppressed. In addition, when the light-shielding layer 23 is formed of a conductive layer, a backdate effect can be assigned to the TFT by supplying a predetermined potential to the light-shielding layer 23.

A thin film transistor (TFT) such as a drive transistor DRT is formed on the undercoat layer 22. A polycrystalline silicon TFT using polycrystalline silicon for the semiconductor layer SC is used as an example of the TFT. In the embodiment, the semiconductor layer SC is formed by using low-temperature polycrystalline silicon. In this example, the drive transistor DRT is an N-channel TFT (NchTFT). The semiconductor layer SC of the NchTFT includes a first region, a second region, a channel region between the first region and the second region, and a low-concentration impurity regions provided between the channel region and the first region and between the channel region and the second region, respectively. One of the first region and the second region functions as a source region, and the other of the first region and the second region functions as a drain region. Incidentally, the array substrate AR may include not only the NchTFT, but a P-channel TFT (PchTFT). In this case, the NchTFT and the PchTFT may be formed simultaneously. In addition, the semiconductor layer SC may be formed by using a semiconductor other than polycrystalline silicon, such as amorphous silicon or an oxide semiconductor.

A gate insulating film GI is formed by using a silicon oxide film, and a gate electrode GE is formed of molybdenum tungsten (MoW). Incidentally, lines and electrodes formed on the gate insulating film GI, such as the gate electrode GE, are often referred to as 1st lines or 1st metals. The gate electrode GE comprises a function of a storage capacitor electrode to be described later in addition to a function of the gate electrode of the TFT. The example of the top-gate TFT has been described. However, the TFT may be a bottom-gate TFT.

An interlayer insulating film 24 is provided on the gate insulating film GI and the gate electrode GE. The interlayer insulating film 24 is constituted by sequentially stacking, for example, a silicon nitride film and a silicon oxide film on the gate insulating film GI and the gate electrode GE. The gate insulating film GI and the interlayer insulating film 24 are not provided in the fold region BA. For this reason, after the gate insulating film GI and the interlayer insulating film 24 are formed on the entire region on the insulating substrate 21 including the fold region BA, the gate insulating film GI and the interlayer insulating film 24 are patterned such that at least a part corresponding to the fold region BA, of the gate insulating film GI and the interlayer insulating film 24, is removed. Furthermore, since the undercoat layer 22 is exposed by removing the interlayer insulating film 24 and the like, the undercoat layer 22 is also patterned such that a part corresponding to the fold region BA is removed. After the undercoat layer 22 is removed, for example, polyimide constituting the insulating substrate 21 is exposed. Incidentally, film reduction that an upper surface of the insulating substrate 21 is partially eroded may occur due to etching of the undercoat layer 22.

In this case, a wiring pattern (not shown) may be formed under each of a step part at an end portion of the interlayer insulating film 24 and a step part at an end portion of the undercoat layer 22. According to this, when routing line LL is formed across the step part, the routing line LL passes on the wiring pattern. Since the gate insulating film GI is provided between the interlayer insulating film 24 and the undercoat layer 22 and since, for example, the light-shielding layer 23 is provided between the undercoat layer 22 and the insulating substrate 21, the wiring pattern can be formed by using the layers.

A first electrode E1, a second electrode E2, and the routing line LL are provided on the interlayer insulating film 24. Each of the first electrode E1, the second electrode E2, and the routing line LL adopts a three-layer stacked structure (Ti-based/Al-based/Ti-based) and includes a lower layer formed of metal materials containing Ti (titanium) as main components such as Ti and an alloy containing Ti, a middle layer formed of metal materials containing Al (aluminum) as main components such as Al and an alloy containing Al, and an upper layer formed of metal materials containing Ti as main components such as Ti and an alloy containing Ti. Incidentally, lines and electrodes formed on the interlayer insulating film 24, such as the first electrode E1, are often referred to as 2nd lines or 2nd metals.

The first electrode E1 is connected to the first region of the semiconductor layer SC and the second electrode E2 is connected to the second region of the semiconductor layer SC. For example, when the first region of the semiconductor layer SC functions as the source region, the first electrode E1 is the source electrode, and the second electrode E2 is the drain electrode. The first electrode E1 forms a storage capacitance Cs together with the interlayer insulating film 24 and a gate electrode (storage capacitance electrode) GE of the TFT. The routing line LL is made to extend up to the peripheral end of the insulating substrate 21 to form a terminal making connection between the first circuit board 3 and the panel driver (driver IC) 5.

Incidentally, since the routing line LL is formed to reach the terminal across the fold region BA, the routing line LL crosses the steps of the interlayer insulating film 24 and the undercoat layer 22. Since the wiring pattern of the light-shielding layer 23 is formed at the step part as described above, conduction can be maintained by making a contact with the lower wiring pattern even if the routing line LL is broken at a recess of the step.

A planarizing film 25 is formed on the interlayer insulating film 24, the first electrode E1, the second electrode E2, and the routing line LL to cover the TFT and the routing line LL. An organic insulating material such as a photosensitive acrylic is frequently used as the planarizing film 25. The planarizing film 25 is excellent in coverage of the wiring step and the planarization of surface as compared with an inorganic insulating film formed by chemical-vapor deposition (CVD), etc.

The planarizing film 25 is removed in the pixel contact part and the peripheral region. A conductive layer 26 is provided on the planarizing film 25. The conductive layer 26 is formed of, for example, ITO as an oxide conductive layer. The conductive layer 26 includes, for example, a conductive layer 26a covering the part where the first electrode E1 and the routing line LL are exposed by removal of the planarizing film 25. One of the objects of providing the conductive layer 26a is to serve as a barrier film to prevent the exposed part of the first electrode E1 and the routing line LL from being damaged in the manufacturing step. The planarizing film 25 and the conductive layer 26 are covered with an insulating layer 27. For example, the insulating layer 27 is formed of a silicon nitride film.

A pixel electrode 28 is formed on the insulating layer 27. The pixel electrode 28 is in contact with the conductive layer 26a through an opening of the insulating layer 27 and is electrically connected to the first electrode E1. In this example, the pixel electrode 28 is a connection terminal to mount a light emitting element 30. The pixel electrode 28 is formed of a single conductive layer or a stacked layer body including two or more conductive layers. In the embodiment, the pixel electrode 28 adopts a two-layer stacked structure (Al-based/Mo-based) and includes a lower layer formed of metal materials containing Mo as main components such as Mo and an alloy containing Mo, and an upper layer formed of metal materials containing Al as main components such as Al and an alloy containing Al.

At the pixel part, the conductive layer 26 includes a conductive layer 26b. The conductive layer 26b is opposed to the pixel electrode 28, held at a constant potential, and functions as a first capacitive electrode layer. The conductive layer 26b is located under the pixel electrode 28. The insulating layer 27 is interposed between the pixel electrode 28 and the conductive layer 26b. The conductive layer 26b, the insulating layer 27, and the pixel electrode 28 form an auxiliary capacitance Cad. Incidentally, the conductive layer 26 includes a conductive layer 26c forming the surface of the terminal part.

An insulating layer 29 is provided on the insulating layer 27 and the pixel electrode 28. The insulating layer 29 is formed of, for example, a silicon nitride. The insulating layer 29 insulates the end part of the pixel electrode 28, etc., and includes an opening which mounts a light emitting element (micro-LED) 30 on a part of the surface of the pixel electrode 28. The size of the opening of the insulating layer 29 is set to be significantly larger than a light emitting element 30 in consideration of the mount displacement amount in a step of mounting the light emitting element 30, etc. For example, when the light emitting element 30 substantially has a mount area of 10 μm×10 μm, the opening is desirably secured to be substantially 20 μm×20 μm.

In the display region DA, the light emitting elements 30 are mounted on the array substrate AR. The light emitting element 30 includes an anode AN serving as a first electrode, a cathode CA serving as a second electrode, and an emitting layer LI emitting light. The light emitting elements 30 having emitting colors of R, G, and B are prepared respectively, and their anode side terminals are in contact with the corresponding pixel electrodes 28 so as to be fixed. Joint between the anode AN of the light emitting element 30 and the pixel electrode 28 is not particularly limited if desirable conduction can be secured between them and does not break the formed object of the array substrate AR. For example, a reflow step using a soldering material molten at a low temperature, a method such as placing the light emitting elements 30 on the array substrate AR via a conductive paste and then sintering the light emitting elements 30, or a method of solid-state welding such as ultrasonic welding with the surface of the pixel electrode 28 and the anode AN of the light emitting element formed of the materials of the same base, can be adopted.

The light emitting element 30 comprises the cathode CA on a side opposite to the anode AN electrically connected to the pixel electrode 28. The light emitting elements 30 are mounted and then an element insulating layer 31 is provided on the pixel electrode 28 and the insulating layer 29. The element insulating layer 31 is formed of a resin material with which a gap part between the light emitting elements 30 is filled, on the insulating layer 29. The element insulating layer 31 exposes the surfaces of the cathodes CA, of the light emitting elements 30.

A counter-electrode 32 is located in at least the display region DA to cover the light emitting elements 30 of all the pixels. The counter-electrode 32 is arranged on the element insulating layer 31 and the surfaces of all the cathodes CA on the counter-electrode 32 side, is in contact with all the cathodes CA, and is electrically connected to all the cathodes CA. The counter-electrode 32 is shared by all the pixels. The counter-electrode 32 is connected to a line (i.e., a second power supply line 42 to be described later) provided on the array substrate AR side at a cathode contact portion provided outside the display region DA. For this reason, the counter-electrode 32 is held at the same constant potential as the electric potential of the second power supply line 42 and makes electric connection between the second power supply line 42 and the cathodes CA of all the light emitting elements 30.

The counter-electrode 32 needs to be formed as a transparent electrode to take emitted light from the light emitting elements 30 and is formed by using, for example, ITO as the transparent conductive material. Incidentally, the conductive layer 26 formed of ITO is often referred to as 1stITO, and the counter-electrode 32 formed of ITO is often referred to as 2ndITO.

In contrast, when side wall parts of the light emitting elements 30 are insulated by a protective film, etc., the gap does not need to be filled with a resin material, etc., and the resin material needs only to insulate at least the anodes AN and the surface of the pixel electrode 28 exposed from the anodes AN. In this case, as shown in FIG. 4, the element insulating layer 31 is formed with a thickness which does not reach the cathodes CA of the light emitting elements 30 and then the counter-electrode 32 is formed. Uneven parts corresponding to the mounting of the light emitting elements 30 partially remain on the surface on which the counter-electrode 32 is formed, but the material forming the counter-electrode 32 may sequentially cover the light emitting elements 30 without a break.

As described above, the array substrate AR has a structure extending from the insulating substrate 21 to the counter-electrode 32. For example, the display device 1 using the light emitting elements 30 according to the embodiment as the display elements is constituted as described above. Incidentally, a cover member such as a cover glass, a touch panel board, etc., may be provided on the counter-electrode 32 as needed. The cover member or the touch panel board may be provided via a filler using resin, etc., to fill the gap with the display device 1.

Next, a circuit configuration of the display device 1 will be described with reference to FIG. 5. A plurality of main pixels PX described above are constituted similarly. Therefore, in FIG. 4, one main pixel PX will be described as a representative of a plurality of main pixels PX. A first pixel SPR, a second pixel SPG, and a third pixel SPB of the main pixel PX are constituted similarly. Thus, the structure (pixel circuit, etc.) of the third pixel SPB will be mainly described for convenience.

As shown in FIG. 5, the third pixel SPB includes the light emitting element 30 and a pixel circuit PC which supplies a drive current to the light emitting element 30. The pixel circuit PC is electrically connected to the pixel electrode 28 shown in FIG. 3. The pixel circuit PC includes a drive transistor DRT, an emission control transistor CCT, a pixel transistor SST, an initializing transistor IST, a storage capacitance Cs, and an auxiliary capacitance Cad as a plurality of elements. The gate driver GD1 includes a reset transistor RST. Incidentally, one output transistor BCT shown in FIG. 5 is arranged for the first pixel SPR, the second pixel SPG, and the third pixel SPB. In FIG. 5, each of the transistors is an NchTFT. In addition, an element capacitance Cled shown in FIG. 5 is an internal capacitance of the light emitting element 30 and is also a capacitance between the anode AN and the cathode CA.

Incidentally, each of the emission control transistor CCT, the reset transistor RST, the pixel transistor SST, the initializing transistor IST, and the output transistor BCT may not be constituted by a transistor. The emission control transistor CCT, the reset transistor RST, the pixel transistor SST, the initializing transistor IST, and the output transistor BCT may be designed only to function as an emission control switch, a reset switch, a pixel switch, an initializing switch, and an output switch, respectively.

In the following descriptions, one of the source electrode and the drain electrode of the transistor is referred to as a first electrode and the other is referred to as a second electrode. In addition, one of electrodes of the capacitive element is referred to as a first electrode and the other is referred to as a second electrode.

The drive transistor DRT, the pixel electrode 28 (FIG. 3), and the light emitting element 30 are serially connected between a first power supply line 41 and the second power supply line 42. The first power supply line 41 is held at a constant potential, and the second power supply line 42 is held at a constant potential different from the electric potential of the first power supply line 41. In the embodiment, the electric potential PVDD of the first power supply line 41 is higher than the electric potential PVSS of the second power supply line 42.

The first electrode of the drive transistor DRT is connected to the light emitting element 30 (anode AN in FIG. 3), the first electrode (first electrode E1 in FIG. 3) of the storage capacitance Cs, and the first electrode (pixel electrode 28 in FIG. 3) of the auxiliary capacitance Cad. The second electrode of the drive transistor DRT is connected to the first electrode of the emission control transistor CCT. The drive transistor DRT is constituted to control a current value to the light emitting element 30.

The second electrode of the emission control transistor CCT is connected to the first electrode of the output transistor BCT. In addition, the second electrode of the emission control transistor CCT is connected to the first electrode of the reset transistor RST via a reset line SV.

The second electrode of the output transistor BCT is connected to the first power supply line 41. In addition, the light emitting element 30 (cathode CA in FIG. 3) is connected to the second power supply line 42.

The first electrode of the pixel transistor SST is connected to the gate electrode of the drive transistor DRT, the first electrode of the initializing transistor IST, and the second electrode of the storage capacitance Cs. The second electrode of the pixel transistor SST is connected to the image signal lines VL. The second electrode of the initializing transistor IST is connected to an initialization power supply line BL.

The storage capacitance Cs is electrically connected between the gate electrode and the first electrode (source electrode) of the drive transistor DRT. In the embodiment, the value (capacitance size) of the storage capacitance Cs is smaller than the value (capacitance size) of the auxiliary capacitance Cad. Incidentally, the above matter is also applied to the first pixel SPR and the second pixel SPG. That is, the value of the storage capacitance Cs is smaller than any one of the value of the auxiliary capacitance Cad of the first pixel SPR, the value of the auxiliary capacitance Cad of the second pixel SPG, and the value of the auxiliary capacitance Cad of the third pixel SPB.

The second electrode (conductive layer 26b in FIG. 3) of the auxiliary capacitance Cad is held at a constant potential. In the embodiment, the second electrode of the auxiliary capacitance Cad is connected to the first power supply line 41 and is held at the same constant potential (PVDD) as the electric potential of the first power supply line 41. Unlike the embodiment, however, the second electrode of the auxiliary capacitance Cad may be held at the same constant potential (PVSS) as the electric potential of the second power supply line 42 or the same constant potential as the electric potential of the third power supply line. An example of the above third power supply line, which is the line held at the constant potential, may be the initialization power supply line BL or a reset power supply line RL.

The reset transistor RST is provided at the gate driver GD1, and the second electrode of the reset transistor RST is connected to the reset power supply line RL.

An image signal Vsig such as a video signal is supplied to the image signal lines VL, an initialization potential Vini is set at the initialization power supply line BL, and a reset power potential Vrst is set at the reset power supply line RL. Incidentally, the image signal Vsig is a signal written to a pixel (in this example, third pixel SPB) based on the above image signal.

The gate electrode of the emission control transistor CCT is connected to a control line SCG. An emission control signal CG is supplied to the control line SCG.

The gate electrode of the output transistor BCT is connected to a control line SBG. An output control signal BG is supplied to the control line SBG.

The gate electrode of the pixel transistor SST is connected to the control line SSG. A pixel control signal SG is supplied to the control lines SSG.

The gate electrode of the initializing transistor IST is connected to a control line SIG. An initialization control signal IG is supplied to the control line SIG.

The gate electrode of the reset transistor RST is connected to a control line SRG. A reset control signal RG is supplied to the control line SRG.

In FIG. 5, it has been described that all the transistors are NchTFT. For example, however, the transistors other than the drive transistor DRT may be PchTFT, and NchTFT and PchTFT may be provided together.

In addition, the drive transistor DRT may be PchTFT. In this case, a current may flow to the light emitting element 30 in an opposite direction to the embodiment. In any case, the auxiliary capacitance Cad may be coupled to the first electrode on the drive transistor DRT side, of the electrodes of the light emitting element 30.

Since the display device 1 comprise two gate drivers GD1 and GD2 (FIG. 2), power can be supplied to one pixel SP from the gate drivers GD1 and GD2 on both sides. It is assumed that a double-sided power supply method is adopted for the above control lines SSG and that a single-sided power supply method is adopted for the control line SCG, the control line SBG, the control line SIG, the reset line SV, etc. However, the display device 1 may not comprise two gate drivers GD1 and GD2 (FIG. 2) but may comprise at least one gate driver GD.

The circuit configuration described with reference to FIG. 5 is a mere example. The circuit configuration of the display device 1 may be the other if the circuit configuration includes the drive transistor DRT, the storage capacitance Cs and the auxiliary capacitance Cad. For example, the circuit configuration described with reference to FIG. 5 may be partially omitted or the other constituent elements may be added.

Figure 6:
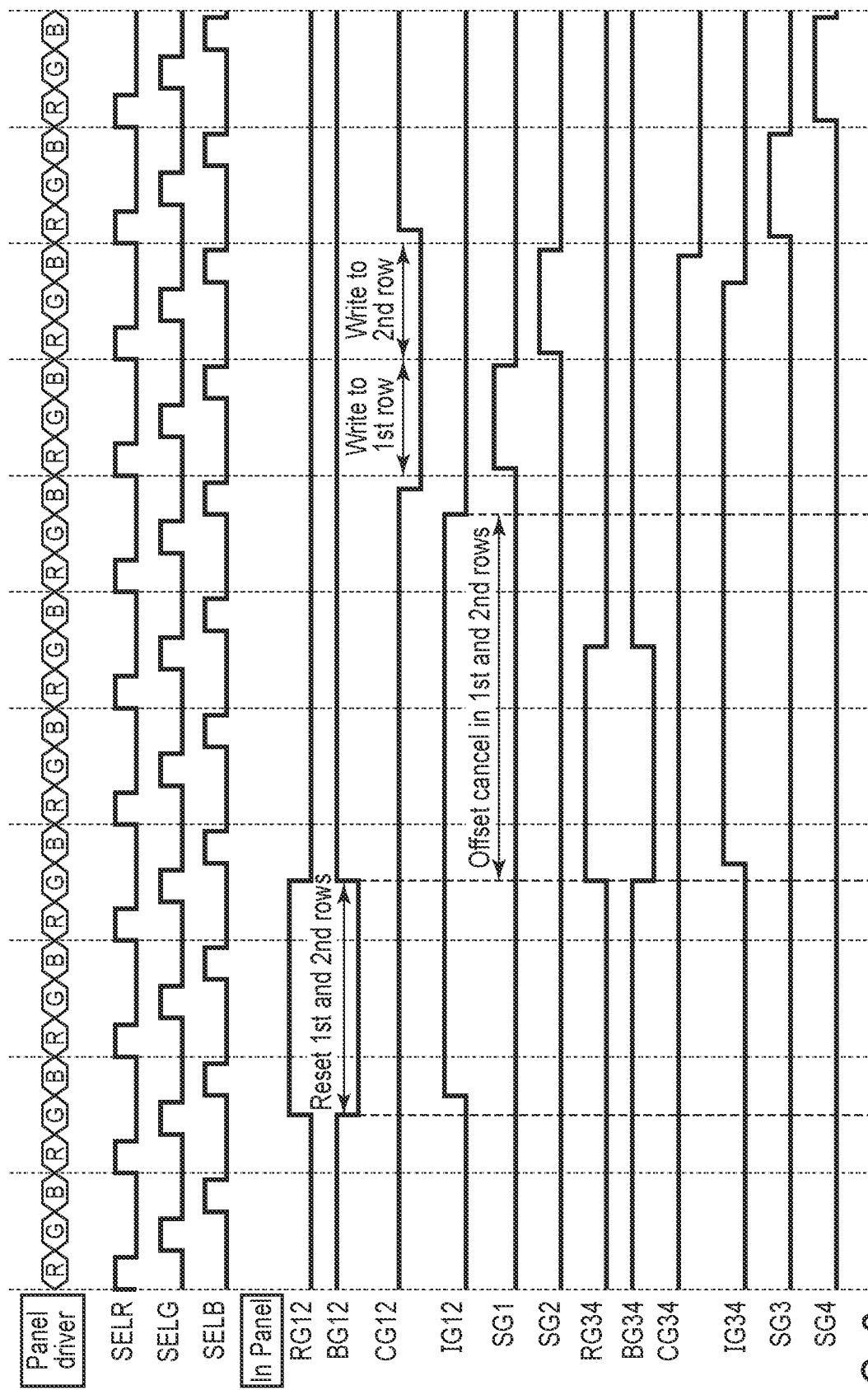
FIG. 6 is a timing chart showing output examples of various signals relating to a reset operation, an offset cancel operation, and a write operation at pixels.

FIG. 6 is a timing chart showing output examples of various signals relating to a reset operation, an offset cancel (OC) operation, a write operation, and an emission operation at the main pixels PX. The signals supplied to the control line SRG, the control line SBG, the control line SCG, the control line SIG, and the control lines SSG will be mainly described here.

Incidentally, it is assumed that the reset operation and the offset cancel operation at the main pixels PX are performed in units of two rows of the main pixels PX. In FIG. 6, in the control lines connected to the main pixels PX in two rows (hereinafter referred to as the main pixels PX in the first and second rows) that are targets of the reset operation and the offset cancel operation, the reset control signal supplied to the control line SRG is referred to as RG12, the output control signal supplied to the control line SBG is referred to as BG12, the emission control signal supplied to the control line SCG is referred to as CG12, and the initialization control signal supplied to the control line SIG is referred to as IG12. Incidentally, the pixel control signal supplied to the control line SSG connected to the main pixel PX in the first row is referred to as SG1, and the pixel control signal supplied to the control line SSG connected to the main pixel PX in the second row is referred to as SG2.

Similarly, in the control lines connected to the main pixels PX in two rows (hereinafter referred to as the main pixels PX in the third and fourth rows) that are targets of the reset operation and the offset cancel operation next to the above main pixels PX in the first and second rows, the reset control signal supplied to the control line SRG is referred to as RG34, the output control signal supplied to the control line SBG is referred to as BG34, the emission control signal supplied to the control line SCG is referred to as CG34, and the initialization control signal supplied to the control line SIG is referred to as IG34. Incidentally, the pixel control signal supplied to the control line SSG connected to the main pixel PX in the third row is referred to as SG3, and the pixel control signal supplied to the control line SSG connected to the main pixel PX in the fourth row is referred to as SG4.

In FIG. 6, timing of various signals to the main pixels PX in the first to fourth rows is shown but, for example, the timing is similar for the main pixels PX in the fifth and following rows.

The signals relating to the reset operation, the offset cancel operation, the image signal write operation, and the emission operation, of the main pixels PX in the first and second rows will be described below. Incidentally, details of various operations will be described later with reference to FIG. 7 to FIG. 11. The reset operation, the offset cancel operation, the write operation, and the emission operation in each of the main pixels PX are performed by selecting one of pixels SPR, SPG, and SPB (RGB) in accordance with the signal (SEL R/G/B) output from the panel driver 5.

In addition, it is assumed that all the transistors are NchTFT in the circuit configuration of the display device 1. When a low (L) level signal is supplied to a gate electrode of such a transistor, the transistor becomes OFF state (non-conductive state). In contrast, when a high (H) level signal is supplied to a gate electrode of such a transistor, the transistor becomes ON state (conductive state).

As shown in FIG. 6 and FIG. 5, first, the output control signal BG12 becomes L level from the H level and the reset control signal RG12 becomes H level from L level prior to the reset operation of the storage capacitance Cs. Thus, the current is blocked between the first power supply line 41 and the second power supply line 42 via the output transistor BCT, and an interval between the output transistor BCT and the anode AN of the light emitting element 30 is reset by the voltage of the reset line SV.

Next, the initialization control signal IG12 becomes H level from L level. The initializing transistor IST becomes the ON state. Thus, the initialization power supply line BL of the initializing potential Vini and the storage capacitance Cs become conductive and the storage capacitance Cs is reset at the initialization voltage (Vini).

Incidentally, the output control signal BG12 which has become L level prior to the resetting of the storage capacitance Cs becomes H level in accordance with completion of a reset period of the storage capacitance Cs. In addition, the reset control signal RG12 becomes L level in accordance with completion of a reset period of the storage capacitance Cs.

In addition, the initialization control signal IG12 becomes L level in accordance with completion of an offset cancel period.

After that, the emission control signal CG12 becomes L level from H level. The current is thereby blocked between the first power supply line 41 and second power supply line 42 via the emission control transistor CCT.

In accordance with this, the pixel control signal SG1 becomes H level from L level. In this case, the current corresponding to the image signal Vsig via the image signal lines VL flows to the storage capacitance Cs, etc., via the pixel transistor SST, and charges corresponding to the image signal Vsig are stored in the storage capacitance Cs. The write operation to the main pixel PX (pixels SPR, SPG, and SPB) in the first row is thereby completed.

Next, the pixel control signal SG2 becomes H level from L level. In this case, the current corresponding to the image signal Vsig via the image signal lines VL flows to the storage capacitance Cs, etc., via the pixel transistor SST, and charges corresponding to the video signal are stored in the storage capacitance Cs. The write operation to the main pixel PX (pixels SPR, SPG, and SPB) in the second row is thereby completed.

When the write operation is completed, the current flows to the light emitting element 30 in accordance with the current value determined based on the above image signal Vsig, and the light emitting element 30 emits light.

The signals relating to the reset operation, the offset cancel operation, the write operation, and the emission operation, of the main pixels PX in the first and second rows have been described. However, the reset operation, the offset cancel operation, the write operation, and the emission operation, of the main pixels PX in the third and fourth rows are the same as the above signals.

In FIG. 6, performing the reset operation and the offset cancel operation in units of two rows (i.e., in two rows as a whole) has been described. According to this structure, however, reduction in the area (width) of the non-display region NDA of the display panel 2, reduction of the power consumption, etc., can be implemented.

A summary of the operations of the display device 1 will be described hereinafter with reference to FIG. 7 to FIG. 11. First, the reset operation on the source side of the drive transistor DRT will be described.

Incidentally, it is assumed in the following descriptions that the first electrode of the drive transistor DRT which is connected to the first electrode of the above storage capacitance Cs is the source electrode and that the second electrode of the drive transistor DRT which is connected to the first electrode of the emission control transistor CCT is the drain electrode.

Figure 7:
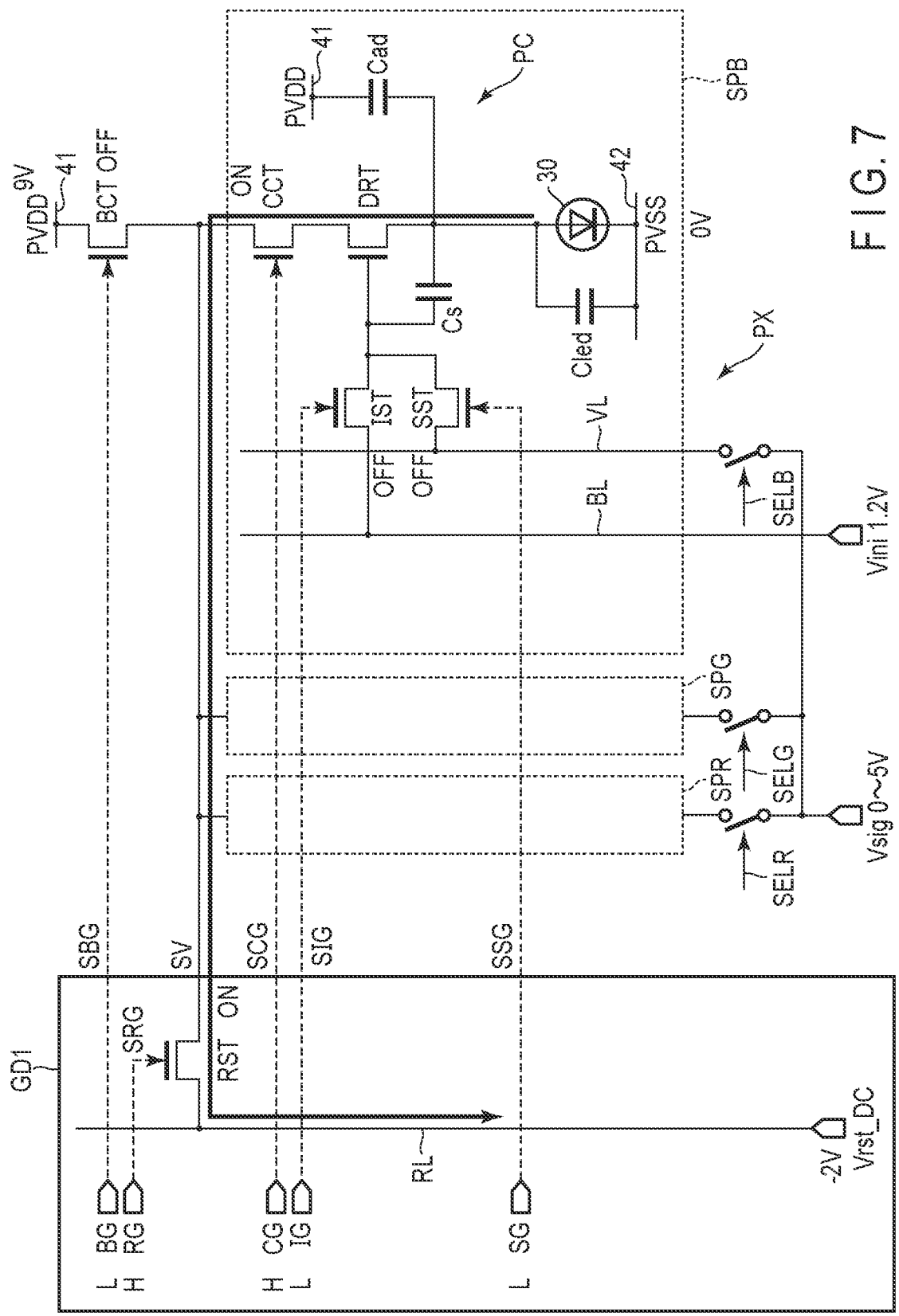
FIG. 7 is a circuit diagram illustrating a method of driving the display device and also illustrating the reset operation on a source side of a drive transistor.

As shown in FIG. 7, in the reset operation on the source side of the drive transistor DRT, the output control signal BG, the initialization control signal IG, and the pixel control signal SG are set to an L level, and the reset control signal RG and the emission control signal CG are set to an H level.

According to this, the output transistor BCT becomes an OFF state (BCT=OFF), the reset transistor RST becomes an ON state (RST=ON), the emission control transistor CCT becomes an ON state (CCT=ON), the initializing transistor IST becomes an OFF state (IST=OFF), and the pixel transistor SST becomes an OFF state (SST=OFF). In the source reset operation, the reset transistor RST is changed to the ON state.

The electric potential of each of the source electrode and the drain electrode of the drive transistor DRT is thereby reset to the same potential as the reset power potential Vrst, and the source reset operation is completed. Incidentally, for example, the reset power potential Vrst is set to an electric potential lower than the electric potential PVSS. For example, the reset power potential Vrst is −2V.

In the source reset operation, when the drive transistor DRT is in the ON state or the OFF state, the drive transistor DRT becomes the ON state since the source electrode of the drive transistor DRT is drawn to −2V (reset power potential Vrst). Incidentally, the minimum value of the image signal Vsig is 0V. Then, since the anode AN side of the light emitting element 30 becomes −2V, i.e., lower than the cathode CA side (PVSS=0V), the light emitting element 30 is turned off.

Incidentally, the voltage of the image signal Vsig written in the previous frame is held in the storage capacitance Cs. Since the second electrode of the storage capacitance Cs is electrically floating, the storage capacitance Cs is not charged or discharged, but the electric potential of the second electrode is varied in accordance with the variation in the electric potential of the first electrode of the storage capacitance Cs.

Next, the reset operation on the gate side of the drive transistor DRT will be described.

As shown in FIG. 8, the initialization control signal IG is changed from the L level to the H level in the reset operation on the gate side of the drive transistor DRT. According to this, the initializing transistor IST is changed to the ON state and the gate reset operation is started. Incidentally, the output transistor BCT and the pixel transistor SST are maintained in the OFF state and the reset transistor RST and the emission control transistor CCT are maintained in the ON state.

In this case, the reset power voltage (Vrst) is supplied to the source electrode of the drive transistor DRT and the first electrode of the storage capacitance Cs, and the initialization voltage (Vini) is supplied to the gate electrode of the drive transistor DRT via the initializing transistor IST. The electric potential of the gate electrode of the drive transistor DRT is thereby reset to the electric potential corresponding to the initialization voltage (Vini) and the information of the previous frame is reset.

The initialization potential Vini is set to an electric potential higher than the reset power potential Vrst. For example, the initializing potential Vini is +1.2V. In the gate reset operation, the drive transistor DRT becomes the ON state since the electric potential (Vini) of the gate electrode to the electric potential (Vrst) of the source electrode becomes a high level at the drive transistor DRT.

In addition, in this period, electric charges based on the difference between the reset power potential Vrst and the initialization potential Vini are held in the storage capacitance Cs. Incidentally, even when the drive transistor DRT is in the ON state, the output transistor BCT is in the OFF state. Therefore, the light emitting element 30 does not illuminate (emit light) in the gate reset operation shown in FIG. 8.

Next, the offset cancel operation will be described.

As shown in FIG. 9, in the offset cancel operation, the output control signal BG is changed from the L level to the H level, and the reset control signal RG is changed from the H level to the L level. According to this, the output transistor BCT is changed to the ON state and the reset transistor RST is changed to the OFF state.

In this case, the current flows from the first power supply line 41 to the drain electrode of the drive transistor DRT via the output transistor BCT.

Since the drive transistor DRT is in the ON state, the current supplied to the drain electrode of the drive transistor DRT flows to the channel of the drive transistor DRT, and the electric potential of the source electrode of the drive transistor DRT is thereby raised. After that, when the difference between the electric potential of the source electrode and the electric potential of the gate electrode in the drive transistor DRT reaches a threshold voltage (Vth) of the drive transistor DRT, the drive transistor DRT becomes the OFF state. In other words, the voltage between the gate electrode and the source electrode in the drive transistor DRT converges to a voltage substantially equal to the threshold value of the drive transistor DRT, and the potential difference corresponding to the threshold value is held in the storage capacitance Cs.

More specifically, the initialization voltage (Vini) is supplied to the gate electrode of the drive transistor DRT. When the electric potential of the source electrode of the drive transistor DRT reaches Vini-Vth, the drive transistor DRT becomes the OFF state. Thus, offset corresponding to the variation of Vth of the drive transistor DRT occurs between the gate electrode and the source electrode of the drive transistor DRT. The offset cancel operation of the threshold value of the drive transistor DRT is thereby completed.

Next, the write operation of the image signal (video signal) Vsig will be described.

As shown in FIG. 10, in the write operation, the emission control signal CG and the initialization control signal IG are changed from the H level to the L level, and the pixel control signal SG is changed from the L level to the H level.

According to this, the emission control transistor CCT and the initializing transistor IST are changed to the OFF state, and the pixel transistor SST is changed to the ON state. In this case, the image signal Vsig is written to the gate electrode of the drive transistor DRT via the pixel transistor SST. For example, the voltage value of the image signal Vsig is a value within a range of 0 to 5V. Then, in the embodiment, the dynamic range of the image signal Vsig is the same in the first pixel SPR, the second pixel SPG, and the third pixel SPB.

Since the source electrode of the drive transistor DRT has electric potentials different for the respective values of Vth by the above offset cancel operation, the voltage Vgs of the drive transistor DRT is different even when the same image signal is written. The voltage Vgs is represented by the following equation 1 at the drive transistor DRT in which writing the image signal Vsig is completed.

$$Vgs = (Vsig - Vini) \times \frac{(Cled + Cad)}{(Cs + Cad + Cled)} + Vth \quad \text{(Equation 1)}$$

Incidentally, as described with reference to FIG. 6, for example, after writing to the main pixel PX in the first row is completed, writing to the pixel in the second row is performed in the same manner. When writing to the pixel in the second row is performed, the pixel transistor SST is set to the OFF state in the main pixel PX in the first row.

In the above write operation, the light emitting element 30 does not illuminate (emit light) since the emission control transistor CCT is in the OFF state.

Next, the emission operation of urging the light emitting element 30 to emit light will be described.

As shown in FIG. 11, in the emission operation, the pixel control signal SG is changed from the H level to the L level and the emission control signal CG is changed from the L level to the H level. According to this, the pixel transistor SST is changed to the OFF state and the emission control transistor CCT is changed to the ON state. In this case, the current Iled flows to the light emitting element 30 through the drive transistor DRT in accordance with the electric potential of the gate electrode of the drive transistor DRT to which the signal is written by the above write operation, and the light emitting element 30 illuminates (emits light).

In the light emission period, the current Iled corresponds to the output current Idrt supplied from the drive transistor DRT (output current in the saturated region of the drive transistor DRT) (Iled=Idrt). The output current Idrt is represented by the following equation 2 where a gain coefficient of the drive transistor DRT is referred to as β.

$$Idrt = \beta \times (Vgs - Vth)^2 \quad \text{(Equation 2)}$$

Then, the output current Idrt is represented by the following equation 3 by substituting the above equation 1 into the equation 2.

$$Idrt = \beta \times \left\{ (Vsig - Vini) \times \frac{(Cled + Cad)}{(Cs + Cad + Cled)} \right\}^2 \quad \text{(Equation 3)}$$

For this reason, the output current Idrt becomes a value which is not dependent on the threshold voltage Vth of the drive transistor DRT, and an influence to the output current Idrt which is caused by irregularity of the threshold voltage of the drive transistor DRT can be eliminated.

Incidentally, the gain coefficient β is defined by the following equation.

$$\beta = 1/2 \times Cox \times \mu \times W/L$$

Incidentally, Cox is the gate electrostatic capacitance per unit area, μ is the mobility, W is the channel width of the drive transistor DRT, and L is the channel length of the drive transistor DRT.

The present inventors, inspecting the luminous efficacy of the light emitting element 30, understood that the luminous efficacy is different for each color (type). In other words, the present inventors understood that the first pixel SPR, the second pixel SPG, and the third pixel SPB are different in the value of the current Iled (output current Idrt) necessary to obtain the largest gradation. More specifically, the present inventors understood that the luminous efficacy of the light emitting element 30 of the first pixel SPR showing a red color is the lowest of the light emitting elements 30 of the pixels SPR, SPG, and SPB.

Thus, to adjust the balance of the luminance level of red light emission by the first pixel SPR, the luminance level of green light emission by the second pixel SPG, and the luminance level of blue light emission by the third pixel SPB, setting the voltage value of the image signal Vsig supplied to the second pixel SPG and the third pixel SPB to a value within a range of 0 to 5V, and setting the voltage value of the image signal Vsig supplied to the first pixel SPR to, for example, a value within a range of 0 to 7V are considered.

In the above case, however, necessity to make the dynamic range of the image signal Vsig supplied to the first pixel SPR larger than the dynamic range of the image signal Vsig supplied to the second pixel SPG and the third pixel SPB is generated. As a result, the value of the image signal Vsig may exceed the voltage specification of the analog output of the panel driver 5. For this reason, obtaining a sufficient voltage durability is difficult in the existing panel driver 5. To employ the panel driver 5 having a sufficient voltage durability, the panel driver 5 needs to be newly developed and the manufacturing costs of the panel driver 5 are thereby increased. In addition, reduction in the power consumption of the panel driver 5 is difficult.

Thus, in the embodiment, the balance of the luminance levels of red, green, and blue is adjusted by adjusting the value (capacitance size) of the auxiliary capacitance Cad. More specifically, as understood from the above equation 3, the value of the auxiliary capacitance Cad of the first pixel SPR having the lowest luminous efficacy is made relatively larger. The value of (Cs+Cad+Cled)/(Cled+Cad) in the above equation 3 becomes closer to 1 by making the auxiliary capacitance Cad larger than the storage capacitance Cs. Attenuation of the gate-source voltage of DRT shown by (Vsig−Vini) can be thereby reduced. That is, the balance of the luminance levels of red, green, and blue can be adjusted by reducing the attenuation amount of the current Iled (output current Idrt) in the first pixel SPR.

The dynamic range of the image signal Vsig can be thereby set to the same value, in the first pixel SPR, the second pixel SPG, and the third pixel SPB. Alternatively, the dynamic range of the image signal Vsig supplied to the first pixel SPR can be made close to the dynamic range of the image signal Vsig supplied to the second pixel SPG and the third pixel SPB.

Since the existing panel driver 5 can be used, increase of the manufacturing costs can be suppressed. A situation that the panel driver 5 can hardly obtain a sufficient voltage durability can be avoided. In addition, the power consumption of the panel driver 5 can be made lower.

Next, the structure of the display panel 2 in a case of making the value of the auxiliary capacitance Cad of the first pixel SPR larger than the values of the auxiliary capacitances Cad of the second pixel SPG and the third pixel SPB will be described. A case where the value of the auxiliary capacitance Cad of the first pixel SPR is the largest, the value of the auxiliary capacitance Cad of the third pixel SPB is the smallest, and the value of the auxiliary capacitance Cad of the second pixel SPG is between two values will be described. This is because the present inventors, inspecting the luminous efficacy of the light emitting element 30, further understood that the luminous efficacy of the light emitting element 30 of the third pixel SPB displaying a blue color is the highest, and that the luminous efficacy of the light emitting element 30 of the second pixel SPG displaying a green color is lower than the luminous efficacy of the light emitting element 30 of the third pixel SPB. The balance of the luminance levels of red, green, and blue can be thereby adjusted finely.

Figure 12:
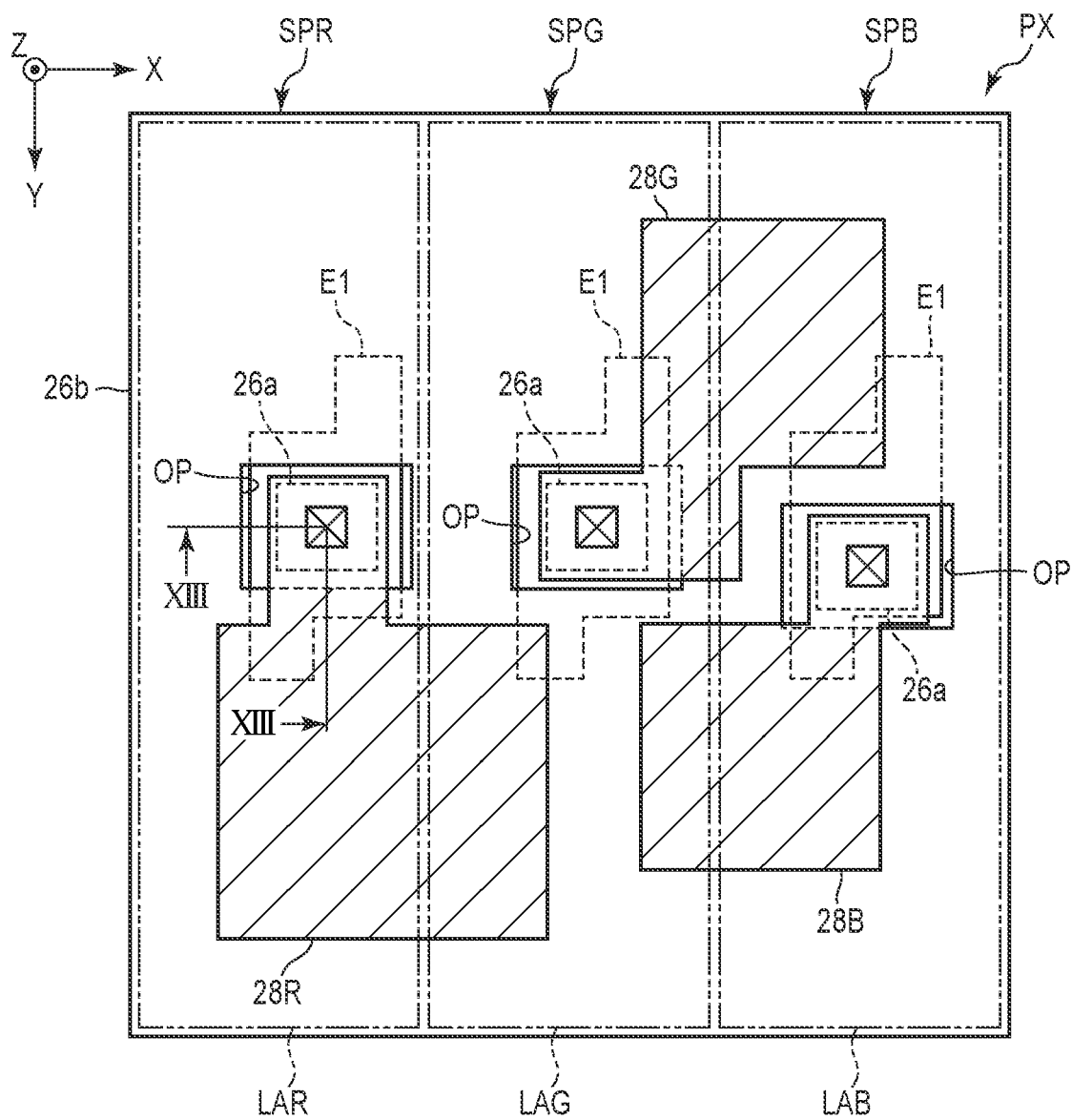
FIG. 12 is a plan view showing a structure of a single main pixel of the display panel of the display device, illustrating a first electrode, a conductive layer, a pixel electrode, etc.
Figure 13:
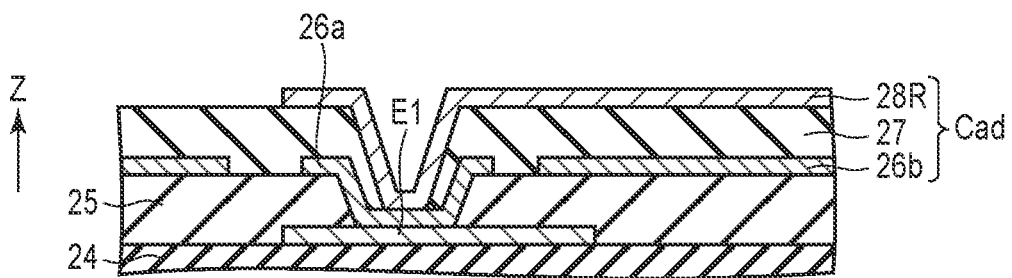
FIG. 13 is a cross-sectional view showing the display panel taken along line XIII-XIII of FIG. 12, illustrating the first electrode, the conductive layer, the pixel electrode, etc.

FIG. 12 and FIG. 13 show a layout example of conductive layers of the pixels SP. A cross-sectional view between XIII-XIII in FIG. 12, i.e., planar view, is illustrated in FIG. 13. As shown in FIG. 12, two or more adjacent pixels SP including the first pixel SPR share the single conductive layer (first capacitive electrode layer) 26b. The conductive layer 26b sequentially extends across two or more pixels SP and is opposed to the pixel electrodes 28 of two or more pixels SP. The conductive layer 26b is located under the pixel electrode 28. In the embodiment, all the pixels SP share the single conductive layer 26b. The conductive layers 26a are located inside the openings OP of the conductive layer 26b.

In the planar view of FIG. 12, the size of the pixel electrode 28R of the first pixel SPR is the largest and the size of the pixel electrode 28B of the third pixel SPB is the smallest of the sizes of the pixel electrodes 28 of the plural types of pixels SPR, SPG, and SPB. The size of the pixel electrode 28G of the second pixel SPG is smaller than the size of the pixel electrode 28R and larger than the size of the pixel electrode 28B. More specifically, as regards the area of the pixel electrodes 28 overlaid on the conductive layer 26b, the first pixel SPR is the largest and the third pixel SPB is the smallest. Incidentally, in FIG. 12, oblique lines are drawn in regions where the pixel electrodes 28 are overlaid on the conductive layer 26b.

The value of the auxiliary capacitance Cad is proportional to the area of the pixel electrodes 28 overlaid on the conductive layer 26b. For this reason, the value of the auxiliary capacitance Cad is different for the type of the pixel SP. The value of the auxiliary capacitance Cad of the first pixel SPR is the largest and the value of the auxiliary capacitance Cad of the third pixel SPB is the smallest of the values of the auxiliary capacitances Cad of the plural types of pixels SP.

In the planar view of FIG. 12, arrangement regions LAR, LAG, and LAB are arranged in the first direction X. The arrangement region LAR is a region where remaining elements other than the auxiliary capacitance Cad of the pixel circuit PC (FIG. 3) of the first pixel SPR are arranged. The arrangement region LAG is a region where remaining elements other than the auxiliary capacitance Cad of the pixel circuit PC of the second pixel SPG are arranged. The arrangement region LAB is a region where remaining elements other than the auxiliary capacitance Cad of the pixel circuit PC of the third pixel SPB are arranged.

In the planar view of FIG. 12, the pixel electrode 28R is located in the arrangement region LAR and is further located in the arrangement region LAG of the second pixel SPG adjacent to the first pixel SPR. Incidentally, each of the pixel electrode 28G and the pixel electrode 28B is located in the arrangement region LAG and the arrangement region LAB. As described above, in the embodiment, the pixel electrode 28 can be provided to be located in the arrangement regions LA of the adjacent pixels SP. This is because remaining elements other than the auxiliary capacitance Cad of the pixel circuit PC (FIG. 3) are located under the conductive layer (first capacitive electrode layer) 26b.

According to the display device 1 of the embodiment constituted as described above, the value of the auxiliary capacitance Cad of the first pixel SPR is the largest of the values of the auxiliary capacitances Cad of the plural types of pixels SP. Then, the value of the auxiliary capacitance Cad of the third pixel SPB is the smallest. For this reason, the balance of the luminance levels of red, green, and blue can be adjusted. The dynamic range of the image signal Vsig can be thereby set to the same value, in the first pixel SPR, the second pixel SPG, and the third pixel SPB. Alternatively, the dynamic range of the image signal Vsig supplied to the first pixel SPR can be made close to the dynamic range of the image signal Vsig supplied to the second pixel SPG and the third pixel SPB.

Based on the above, the display device 1 capable of suppressing the increase of manufacturing costs can be obtained. Furthermore, the display device 1 capable of attempting to reduce the power consumption can be obtained.

Modified Example 1

Figure 14:
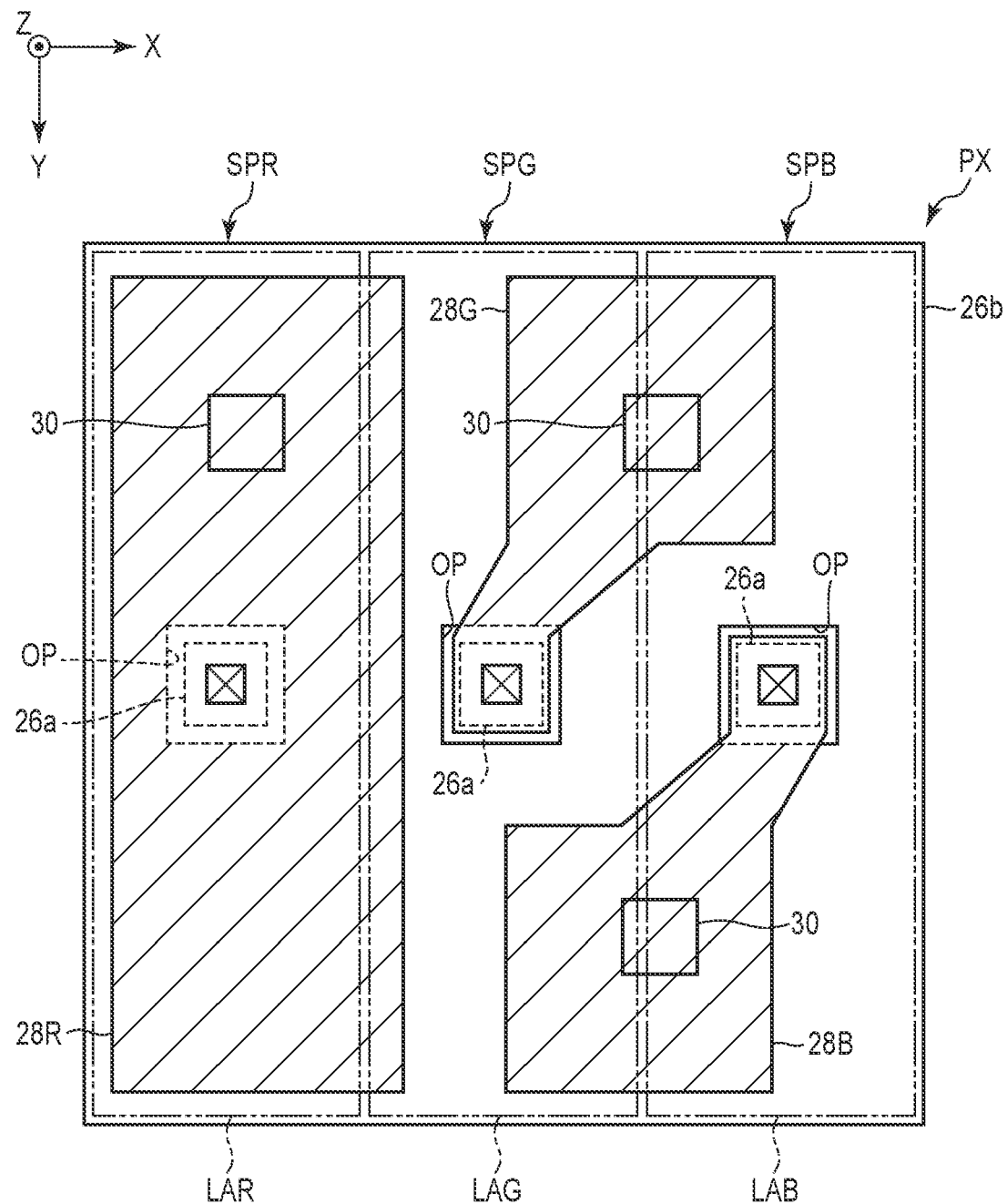
FIG. 14 is a plan view showing a structure of the single main pixel of the display panel of the display device according to modified example 1 of the embodiment, illustrating the conductive layers, pixel electrodes, the light emitting elements, etc.

Next, the display device 1 according to a modified example 1 of the embodiment will be described. FIG. 14 is a plan view showing a structure of the single main pixel PX of the display panel 2 of the display device 1 according to modified example 1 of the embodiment, illustrating the conductive layers 26a and 26b, pixel electrodes 28R, 28G, and 28B, the light emitting elements 30, etc.

As shown in FIG. 14, modified example 1 is roughly different from the embodiment with respect to a feature that the pixel electrode 28R has a rectangular shape and extends in the second direction Y. The pixel electrode 28R is opposed to the pixel electrode 28G and the pixel electrode 28B in the first direction X. In FIG. 14, too, oblique lines are drawn in regions where the pixel electrodes 28 are overlaid on the conductive layer 26b. As regards the area of the pixel electrode 28 overlaid on the conductive layer 26b, the second pixel SPG is the same as the third pixel SPB, and the first pixel SPR is the largest. As regards the values of the auxiliary capacitances Cad of plural types of pixels SP, the second pixel SPG is the same as the third pixel SPB, and the first pixel SPR is the largest.

In modified example 1 configured as described above, the value of the auxiliary capacitance Cad of the first pixel SPR can be made relatively larger. For example, the value of the auxiliary capacitance Cad of the first pixel SPR can be adjusted to be two or more times as large as the auxiliary capacitance Cad of each of the second pixel SPG and the third pixel SPB. For this reason, the same advantages as the above-described embodiment can be obtained in modified example 1, too.

Modified Example 2

Figure 15:
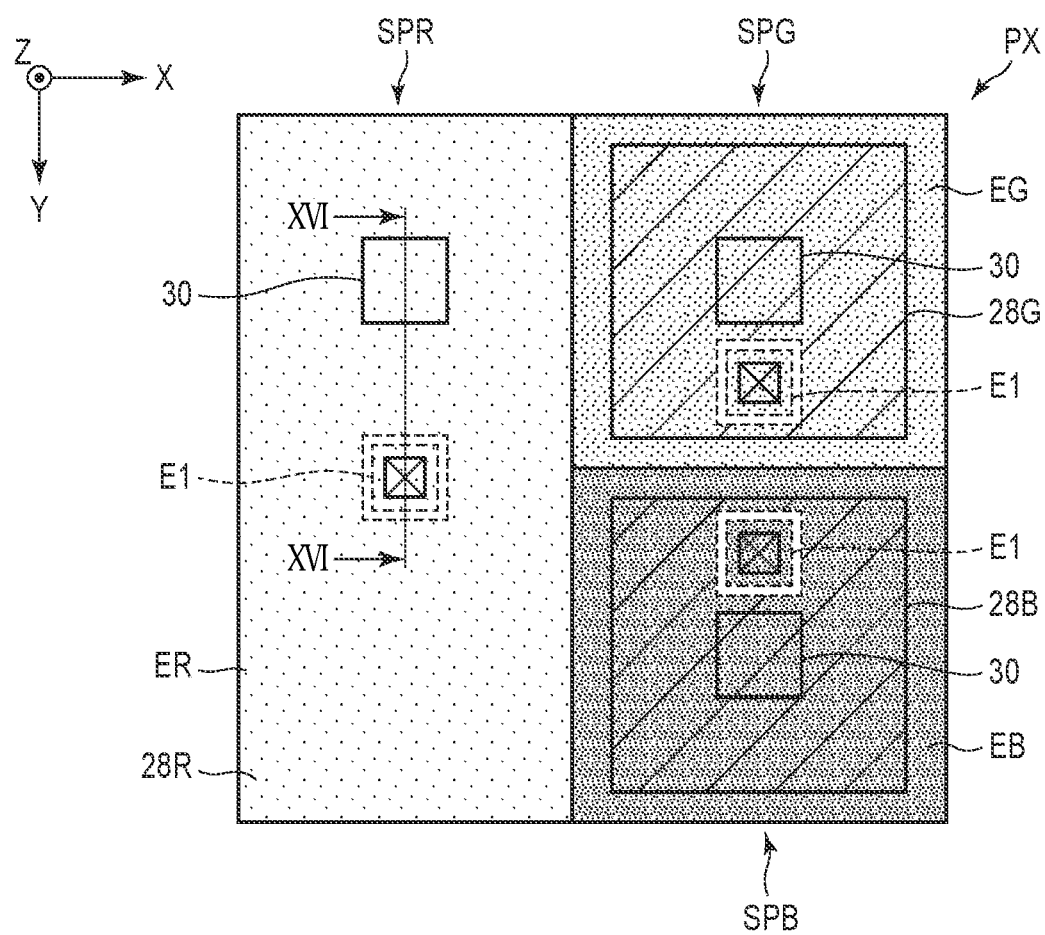
FIG. 15 is a plan view showing a structure of the single main pixel of the display panel of the display device according to modified example 2 of the embodiment, illustrating the first electrode, the conductive layers, the pixel electrodes, the light emitting elements, etc.
Figure 16:
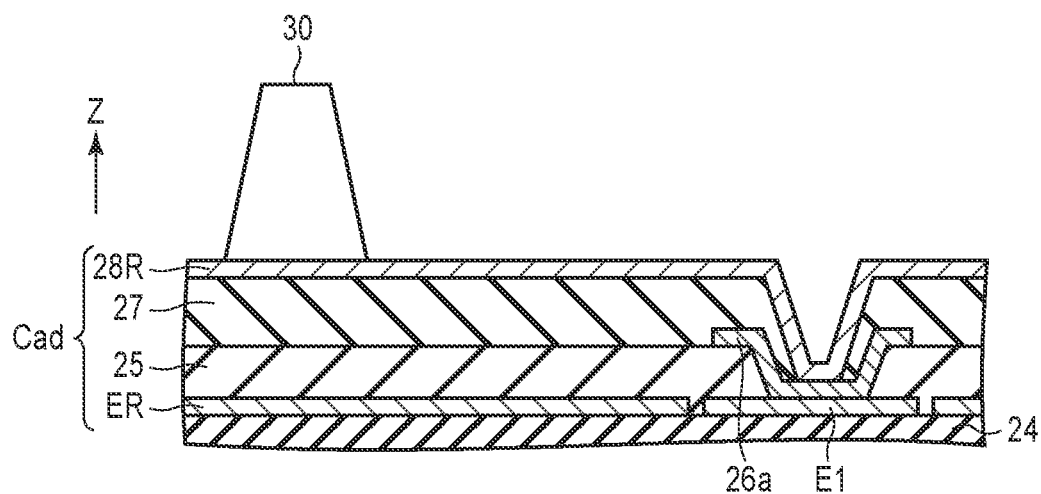
FIG. 16 is a cross-sectional view showing the display panel taken along line XVI-XVI of FIG. 15, illustrating the first electrode, the conductive layer, the pixel electrode, the light emitting element, etc.

Next, the display device 1 according to a modified example 2 of the embodiment will be described. FIG. 15 is a plan view showing a structure of the single main pixel PX of the display panel 2 of the display device 1 according to modified example 2 of the embodiment, illustrating the first electrode E1, the conductive layers ER, EG, and EB, the pixel electrodes 28R, 28G, and 28B, the light emitting elements 30, etc. FIG. 16 is a cross-sectional view showing the display panel 2 taken along line XVI-XVI of FIG. 15, illustrating the first electrode E1, the conductive layer ER, the pixel electrode 28R, the light emitting element 30, etc.

As shown in FIG. 15 and FIG. 16, modified example 2 is roughly different from the embodiment with respect to a feature that each of the conductive layers ER, EG, and EB functions as a first capacitive electrode layer. The display panel 2 of modified example 2 is formed without the conductive layer 26b. The first pixel SPR is opposed to both the second pixel SPG and the third pixel SPB in the first direction X. The second pixel SPG is opposed to the third pixel SPB in the second direction Y. The conductive layers ER, EG, and EB are connected to power supply lines of a constant potential. For example, the conductive layers ER, EG, and EB are connected to the first power supply line 41. The conductive layers ER, EG, and EB may partially constitute the first power supply line 41. Incidentally, more appropriately, each of the conductive layers ER, EG, and EB may be referred to as a line or an electrode.

In planar view of FIG. 15, the pixel electrode 28 is overlaid on the only single conductive layer. The pixel electrode 28R is overlaid on the conductive layer ER of the first pixel SPR. The pixel electrode 28G is overlaid on the conductive layer EG of the second pixel SPG. The pixel electrode 28B is overlaid on the conductive layer EB of the third pixel SPB. The first pixel SPR will be described as a representative of the plural types of pixels. The auxiliary capacitance Cad of the first pixel SPR is formed of the conductive layer ER, the planarizing film 25, the insulating layer 27, and the pixel electrode 28R.

The pixel electrode 28R is in contact with the conductive layer 26a. However, the display panel 2 may be formed without the conductive layer 26a. In this case, the pixel electrode 28R may be in direct contact with the first electrode E1.

The conductive layers ER, EG, and EB are provided between the interlayer insulating film 24 and the planarizing film 25. However, a layer in which the conductive layers ER, EG, and EB are provided is not limited particularly. For example, the conductive layers ER, EG, and EB may be provided between the planarizing film 25 and the insulating layer 27.

In FIG. 15, oblique lines are drawn in a region where the pixel electrode 28 is overlaid on the conductive layer ER, EG, or EB. As regards the area of the pixel electrode 28 overlaid on the conductive layer ER, EG, or EB, the second pixel SPG is the same as the third pixel SPB, and the first pixel SPR is the largest. As regards the values of the auxiliary capacitances Cad of plural types of pixels SP, the second pixel SPG is the same as the third pixel SPB, and the first pixel SPR is the largest.

Based on the above, the same advantages as the above-described embodiment can be obtained in the modified example 2, too.

Modified Example 3

Figure 17:
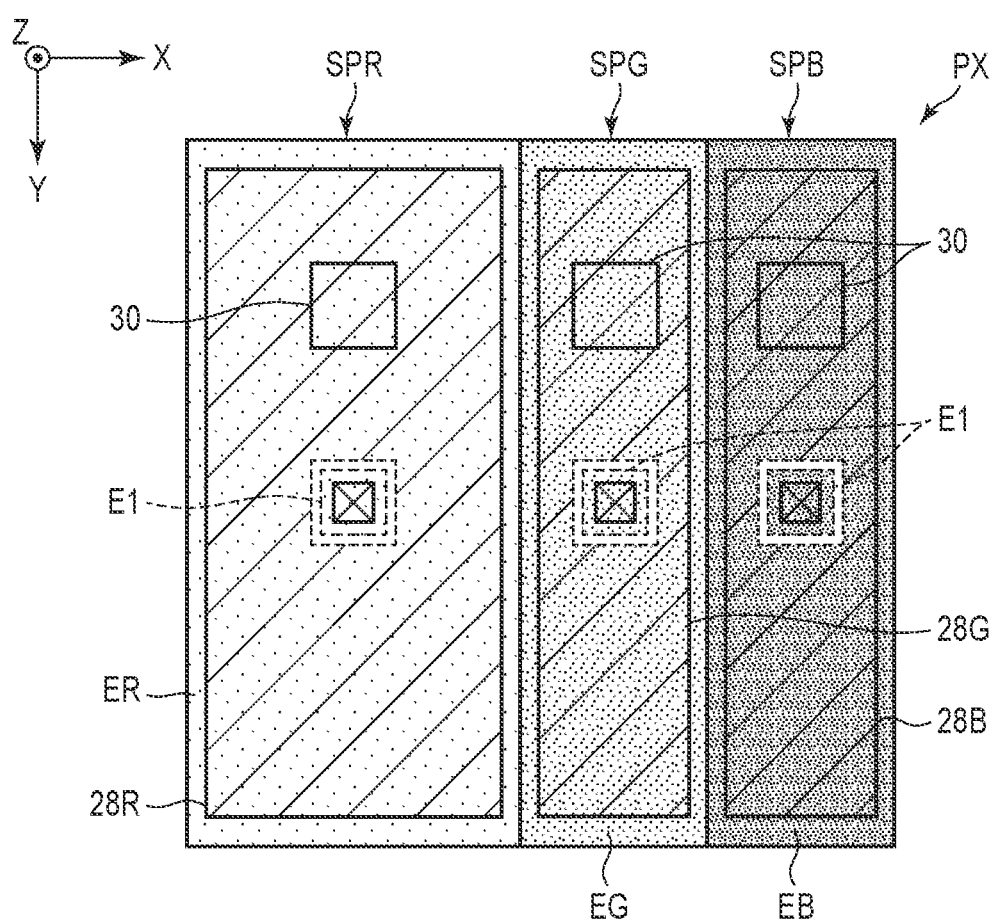
FIG. 17 is a plan view showing a structure of the single main pixel of the display panel of the display device according to modified example 3 of the embodiment, illustrating the first electrode, the conductive layers, the pixel electrodes, the light emitting elements, etc.

Next, the display device 1 according to a modified example 3 of the embodiment will be described. FIG. 17 is a plan view showing a structure of the single main pixel PX of the display panel 2 of the display device 1 according to modified example 3 of the embodiment, illustrating the first electrode E1, the conductive layers ER, EG, and EB, the pixel electrodes 28R, 28G, and 28B, the light emitting elements 30, etc.

As shown in FIG. 17, the first pixel SPR, the second pixel SPG, and the third pixel SPB may be arranged in the first direction X, in the main pixel PX. The pixel electrodes 28R, 28G, and 28B are arranged in the first direction X, and the conductive layers ER, EG, and EB are arranged in the first direction X. The pixel electrodes 28R, 28G, and 28B have the same length in the second direction Y. The pixel electrode 28G and the pixel electrode 28B have the same width and the pixel electrode 28R has the largest width, in the first direction X.

In FIG. 17, oblique lines are drawn in a region where the pixel electrode 28 is overlaid on the conductive layer ER, EG, or EB. As regards the area of the pixel electrode 28 overlaid on the conductive layer ER, EG, or EB, the second pixel SPG is the same as the third pixel SPB, and the first pixel SPR is the largest. As regards the values of the auxiliary capacitances Cad of plural types of pixels SP, the second pixel SPG is the same as the third pixel SPB, and the first pixel SPR is the largest.

Based on the above, the same advantages as the above-described embodiment can be obtained in the modified example 3, too.

Modified Example 4

Figure 18:
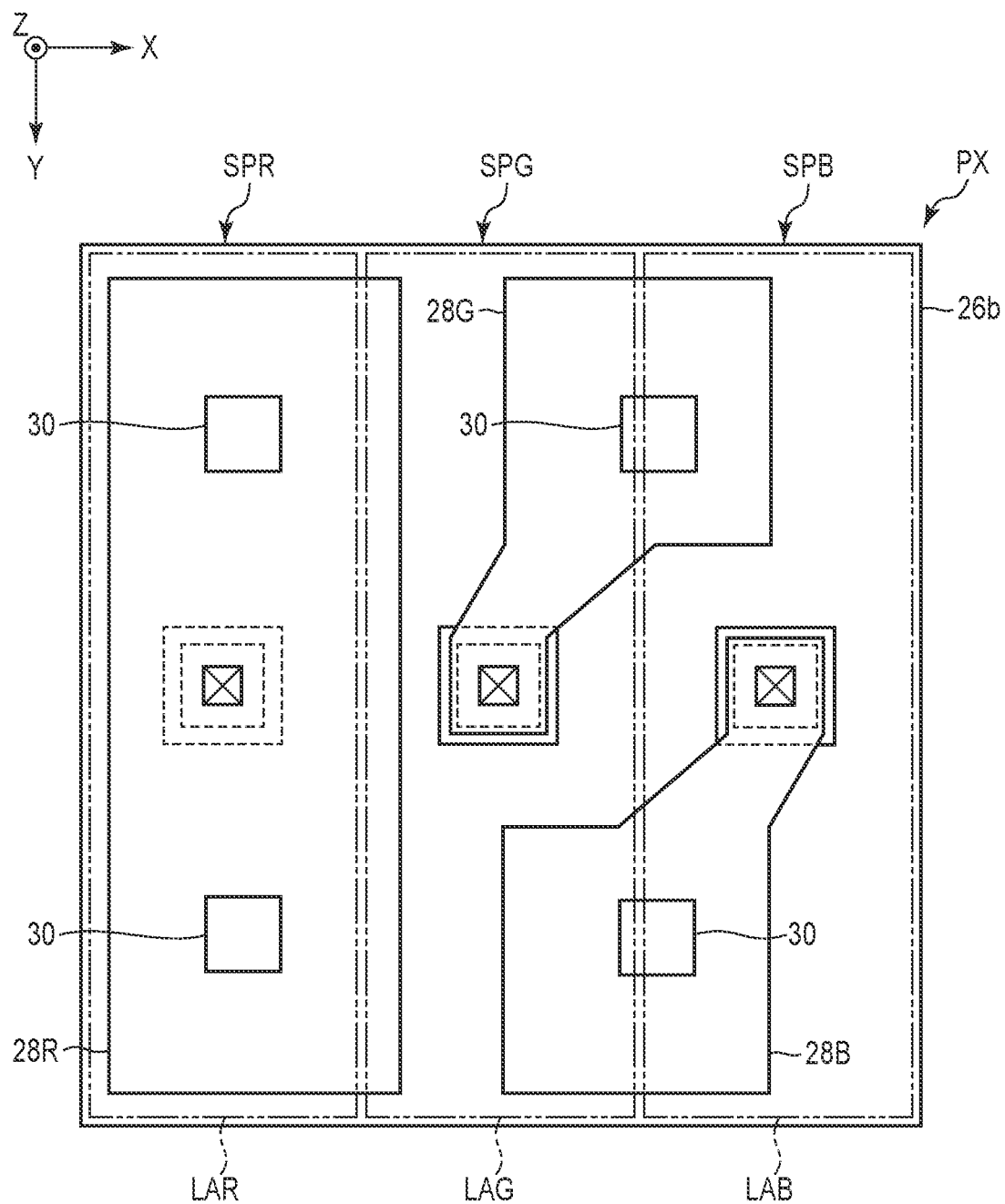
FIG. 18 is a plan view showing a structure of the single main pixel of the display panel of the display device according to modified example 4 of the embodiment, illustrating the conductive layers, pixel electrodes, the light emitting elements, etc.

Next, the display device 1 according to a modified example 4 of the embodiment will be described. FIG. 18 is a plan view showing a structure of the single main pixel PX of the display panel 2 of the display device 1 according to modified example 4 of the embodiment, illustrating the conductive layers 26a and 26b, pixel electrodes 28R, 28G, and 28B, the light emitting elements 30, etc.

As shown in FIG. 18, the area in which the anode AN (first electrode) and the cathode CA (second electrode) of the light emitting element 30 are opposed may be the largest in the first pixel SPR of the plural types of pixels SP. In the modified example 4, each of the second pixel SPG and the third pixel SPB includes one light emitting element 30 while the first pixel SPR includes two light emitting elements 30. The current density at the light emitting element 30 of the first pixel SPR can be made lower as compared with a case where the first pixel SPR includes one light emitting element 30. In the first pixel SPR where the value of the current Iled (output current Idrt) becomes relatively larger, the current density at the light emitting element 30 can be made lower. For this reason, a lifetime of a product of the light emitting element 30 of the first pixel SPR can be extended.

The display panel 2 of modified example 4 is constituted similarly to the display panel 2 of the above-described modified example 1 except for the structure relating to the light emitting element 30. Based on the above, the same advantages as the above-described embodiment can be obtained in the modified example 4, too.

Modified Example 5

Next, the display device 1 according to a modified example 5 of the embodiment will be described. FIG. 19 is a cross-sectional view showing the display panel 2 of the display device 1 according to modified example 5 of the embodiment, illustrating the first electrode E1, the conductive layer 26a, the pixel electrode 28, the counter-electrode 32, etc.

As shown in FIG. 19, in modified example 5, the first capacitive electrode layer of the auxiliary capacitance Cad may be composed of a part of the counter-electrode 32 located above the pixel electrode 28. The pixel electrode 28, the element insulating layer (insulating layer) 31, and the counter-electrode 32 form the auxiliary capacitance Cad.

As regards the values of the auxiliary capacitances Cad of plural types of pixels, the second pixel is the same as the third pixel, and the first pixel is the largest. Incidentally, unlike the above, the value of the auxiliary capacitance Cad of the first pixel, of the values of the auxiliary capacitances Cad of the plural types of pixels may be the largest, and the value of the auxiliary capacitance Cad of the third pixel may be the smallest.

Based on the above, the same advantages as the above-described embodiment can be obtained in the modified example 5, too.

Modified Example 6

Next, the display device 1 according to a modified example 6 of the embodiment will be described. FIG. 20 is a cross-sectional view showing the display panel 2 of the display device 1 according to modified example 6 of the embodiment, illustrating the first electrode E1, the conductive layers 26a and 26b, the pixel electrode 28, the counter-electrode 32, etc.

As shown in FIG. 20, the auxiliary capacitances Cad may include a first capacitive component Cad1 and a second capacitive component Cad2, in each of the pixels of modified example 6. The conductive layer 26b serving as the first capacitive electrode layer is located under the pixel electrode 28. The first capacitive component Cad1 is formed by the pixel electrode 28, the insulating layer 27, and the conductive layer 26b. The second capacitive component Cad2 is formed by the pixel electrode 28, the element insulating layer (insulating layer) 31, and the counter-electrode 32.

In this case, the conductive layer 26b may be held at the same constant potential as the counter-electrode 32. Alternatively, the conductive layer 26b may be held at the constant potential different from the counter-electrode 32. In the latter case, the conductive layer 26b is held at the same constant potential as the electric potential of the first power supply line 41 or the third power supply line. The value of the auxiliary capacitance Cad is a sum of the capacitive value of the first capacitive component Cad1 and the capacitive value of the second capacitive component Cad2.

As regards the values of the auxiliary capacitances Cad of plural types of pixels, the second pixel is the same as the third pixel, and the first pixel is the largest. Incidentally, unlike the above, the value of the auxiliary capacitance Cad of the first pixel, of the values of the auxiliary capacitances Cad of the plural types of pixels may be the largest, and the value of the auxiliary capacitance Cad of the third pixel may be the smallest.

Based on the above, the same advantages as the above-described embodiment can be obtained in the modified example 6, too.

While the embodiments and modified examples have been described, the embodiments and the modified examples have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the inventions. The embodiments and the modified examples can also be combined as needed.

For example, in the embodiment, the micro-LED display device using the micro-LED as the light emitting element has been mainly described. However, the display device 1 according to the embodiment may be an organic EL display device using the organic electroluminescent (EL) element as the light emitting element. The display device is effective when the organic EL elements of the respective colors are different in luminous efficacy.

What is claimed is:

1. A display device comprising:
a first pixel electrode;
a second pixel electrode;
a third pixel electrode;
a red color LED jointed on the first pixel electrode;
a green color LED jointed on the second pixel electrode;
a blue color LED jointed on the third pixel electrode; and
a capacitive electrode extending across the first to third pixel electrodes and overlapping each of the first to third pixel electrodes,
wherein
a size of the first pixel electrode is larger than a size of the second pixel electrode,
the size of the first pixel electrode is larger than a size of the third pixel electrode,
an overlapping area of the first pixel electrode and the capacitive electrode is larger than an overlapping area of the second pixel electrode and the capacitive electrode, and
the overlapping area of the first pixel electrode and the capacitive electrode is larger than an overlapping area of the third pixel electrode and the capacitive electrode.

2. The display device of claim 1, wherein
an insulating layer is interposed between the capacitive electrode and the first to third pixel electrodes, and
the insulating layer is formed of an inorganic material.

3. The display device of claim 1, wherein
an insulating layer is interposed between the capacitive electrode and the first to third pixel electrodes, the insulating layer covers the red color LED, the green color LED and the blue color LED, and
the insulating layer is formed of a resin material.

4. The display device of claim 1, further comprising:
a first insulating layer; and
a second insulating layer,
wherein
the capacitive electrode includes a first capacitive electrode and a second capacitive electrode,
each of the first and second capacitive electrode extends across the first to third pixel electrodes and overlapping each of the first to third pixel electrodes,
the first capacitive electrode is located under the first to third pixel electrodes,
the second capacitive electrode is located above the first to third pixel electrodes,
the first insulating layer is interposed between the first capacitive electrode and the first to third pixel electrodes,
the second insulating layer is interposed between the second capacitive electrode and the first to third pixel electrodes, and
the second insulating layer covers the red color LED, the green color LED and the blue color LED.

5. The display device of claim 4, wherein
the first insulating layer is formed of an inorganic material, and
the second insulating layer is formed of a resin material.

6. The display device of claim 1, further comprising
a second red color LED,
wherein
the second red color LED is jointed on the first pixel electrode,
the red color LED and the green color LED are opposed to each other in a first direction,
the second red color LED and the blue color LED are opposed to each other in the first direction, and
the red color LED and the second red color LED are opposed to each other in a second direction intersecting the first direction.

7. The display device of claim 1, wherein
the first pixel electrode is connected to a first pixel circuit in a first arrangement region,
the second pixel electrode is connected to a second pixel circuit in a second arrangement region,
the third pixel electrode is connected to a third pixel circuit in a third arrangement region, and
the first pixel electrode overlaps each of a part of the first arrangement region and a part of the second arrangement region.

8. The display device of claim 7, wherein the first pixel electrode does not overlap the third arrangement region.

9. The display device of claim 8, wherein
the second pixel electrode overlaps each of a part of the second arrangement region and a part of the third arrangement region, and
the third pixel electrode overlaps each of a part of the second arrangement region and a part of the third arrangement region.

10. The display device of claim 9, wherein
the second pixel electrode does not overlap the first arrangement region, and
the third pixel electrode does not overlap the first arrangement region.

11. The display device of claim 1, wherein the size of the second pixel electrode is larger than the size of the third pixel electrode.

12. The display device of claim 1, wherein the size of the first pixel electrode is more than twice the size of the second pixel electrode.

* * * * *